United States Patent
Nakagawa

(10) Patent No.: US 9,064,913 B2
(45) Date of Patent: Jun. 23, 2015

(54) SUBSTRATE PROCESSING APPARATUS, METHOD OF MANUFACTURING SEMICONDUCTOR DEVICE, AND NON-TRANSITORY COMPUTER-READABLE RECORDING MEDIUM

(71) Applicant: Hitachi Kokusai Electric Inc., Tokyo (JP)

(72) Inventor: Hitoshi Nakagawa, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 14/226,031

(22) Filed: Mar. 26, 2014

(65) Prior Publication Data

US 2014/0206204 A1    Jul. 24, 2014

Related U.S. Application Data

(63) Continuation of application No. PCT/JP2012/074060, filed on Sep. 20, 2012.

(30) Foreign Application Priority Data

Sep. 26, 2011 (JP) .................................. 2011-209168

(51) Int. Cl.
| | |
|---|---|
| H01L 21/00 | (2006.01) |
| H01L 21/31 | (2006.01) |
| H01L 21/469 | (2006.01) |
| H01L 21/67 | (2006.01) |
| F01K 25/14 | (2006.01) |
| F01K 13/00 | (2006.01) |
| F01K 25/10 | (2006.01) |
| F22B 1/18 | (2006.01) |
| H01L 21/324 | (2006.01) |

(52) U.S. Cl.
CPC .......... *H01L 21/67115* (2013.01); *F01K 25/14* (2013.01); *H01L 21/67017* (2013.01); *H01L 21/67109* (2013.01); *F01K 13/00* (2013.01); *F01K 25/10* (2013.01); *F22B 1/18* (2013.01); *H01L 21/324* (2013.01)

(58) Field of Classification Search
USPC .................. 438/782, 795, 799; 257/E21.328, 257/E21.333
See application file for complete search history.

(56) References Cited

U.S. PATENT DOCUMENTS

| | | | |
|---|---|---|---|
| 2009/0190908 A1* | 7/2009 | Shibagaki | 392/416 |
| 2012/0108080 A1* | 5/2012 | Akao et al. | 438/795 |

FOREIGN PATENT DOCUMENTS

JP        07-183370 A        7/1995

* cited by examiner

*Primary Examiner* — Mohsen Ahmadi
(74) *Attorney, Agent, or Firm* — Volpe and Koenig, P.C.

(57) ABSTRACT

Provided is a substrate processing apparatus including a reaction chamber configured to heat a substrate; a transfer chamber configured to transfer the heated substrate; a refrigerant flow path installed in the reaction chamber; a refrigerant flow path installed in the reaction chamber; a refrigerant supply unit installed in the refrigerant flow path; a refrigerant exhaust unit installed in the refrigerant flow path; a transfer chamber refrigerant supply unit installed in the transfer chamber; a transfer chamber refrigerant exhaust unit installed in the transfer chamber; a heat exchanger connected to the refrigerant exhaust pipe and the transfer chamber refrigerant exhaust unit; a turbine connected to the heat exchanger; a generator connected to the turbine; and a control unit configured to control the refrigerant supply unit and the transfer chamber refrigerant supply unit.

7 Claims, 12 Drawing Sheets

<Prior Art>

US 9,064,913 B2

SUBSTRATE PROCESSING APPARATUS, METHOD OF MANUFACTURING SEMICONDUCTOR DEVICE, AND NON-TRANSITORY COMPUTER-READABLE RECORDING MEDIUM

CROSS-REFERENCE TO RELATED PATENT APPLICATION

This patent application claims priority and benefit of Japanese Patent Application No. 2011-209168 filed on Sep. 26, 2011 in the Japanese Patent Office and International Application No. PCT/JP2012/074060 filed on Sep. 20, 2012, the entire contents of which are hereby incorporated by reference.

BACKGROUND OF THE INVENTION

1. Field of the Invention

The present invention relates to a substrate processing apparatus capable of effectively using exhaust heat, a method of manufacturing a semiconductor device, and a non-transitory computer-readable recording medium.

2. Description of the Related Art

Conventionally, there is a device that uses heat exhausted from a substrate processing apparatus and in which a vapor generation unit is installed around a reaction container and a power generation unit is installed in the vapor generation unit to generate power.

SUMMARY OF THE INVENTION

However, the related art described above simply suggests an object to generate power by installing a vapor generation unit around a reaction container and installing a power generation unit in the vapor generation unit and does not specify a method of accomplishing the object. Exemplary embodiments of the invention described in the present disclosure are designed to specify methods of accomplishing the object. It is an object of the present invention to provide a substrate processing apparatus capable of reducing energy consumption therein and efficiently generating power by collecting heat exhausted therefrom, and a method of manufacturing a semiconductor device.

According to one aspect of the present invention, there is provided a substrate processing apparatus including: a reaction chamber where a substrate is heated; a transfer chamber configured to accommodate the substrate heated in the reaction chamber; a refrigerant flow path installed at the reaction chamber; a reaction chamber refrigerant supply unit configured to supply a first refrigerant into the refrigerant flow path; a reaction chamber refrigerant exhaust unit configured to exhaust the first refrigerant from the refrigerant flow path; a transfer chamber refrigerant supply unit installed in the transfer chamber; a transfer chamber refrigerant exhaust unit installed in the transfer chamber; a heat exchanger connected to the reaction chamber refrigerant exhaust unit and the transfer chamber refrigerant exhaust unit; a turbine connected to the heat exchanger; a generator connected to the turbine; and a control unit configured to control the reaction chamber refrigerant supply unit and the transfer chamber refrigerant supply unit.

According to another aspect of the present invention, there is provided a method of manufacturing a semiconductor device, including: (a) transferring a substrate from a transfer chamber to a reaction chamber; (b) heating the substrate in the reaction chamber; and (c) supplying a first refrigerant to a refrigerant flow path installed in the reaction chamber; exhausting the first refrigerant; and generating power from heat of the exhausted first refrigerant; and (d) transferring the substrate from the reaction chamber to the transfer chamber; supplying a second refrigerant into the transfer chamber with the substrate accommodated in the transfer chamber; exhausting the second refrigerant from the transfer chamber; and generating power from heat of the exhausted second refrigerant.

According to still another aspect of the present invention, there is provided a non-transitory computer-readable recording medium storing a program that causes a computer to execute: a sequence of transferring a substrate from a transfer chamber to a reaction chamber; a sequence of heating the substrate in the reaction chamber; a cooling sequence including supplying a first refrigerant to a refrigerant flow path installed in the reaction chamber, exhausting the first refrigerant, and generating power from heat of the exhausted first refrigerant; and a substrate unloading sequence including transferring the substrate from the reaction chamber to the transfer chamber, supplying a second refrigerant into the transfer chamber while the substrate is accommodated in the transfer chamber, exhausting the second refrigerant from the transfer chamber, and generating power from heat of the exhausted second refrigerant.

DETAILED DESCRIPTION OF THE PREFERRED EMBODIMENTS

Hereinafter, an exemplary embodiment of the present invention will be described with reference to the accompanying drawings.

[Summary of Embodiment]

Figure 4:
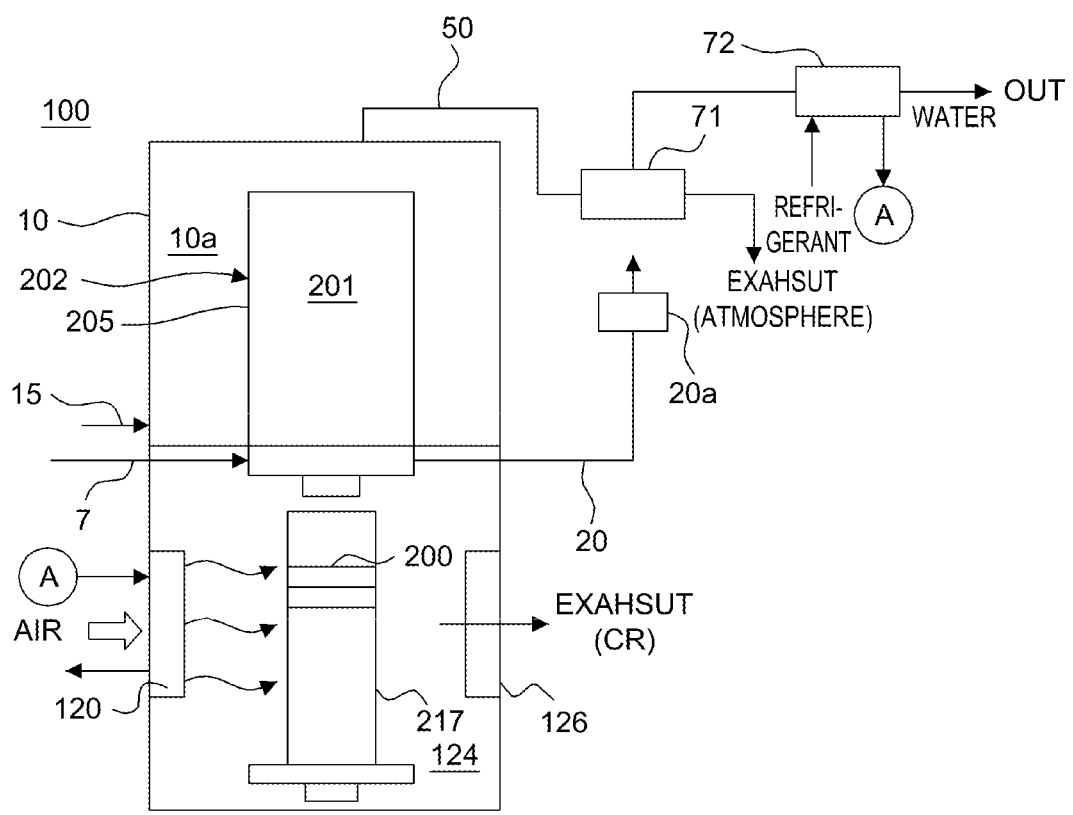
FIG. 4 is a diagram schematically illustrating a structure of a conventional substrate processing apparatus.

First, an outline of a system for collecting heat exhausted from a substrate processing apparatus will be described. FIG. 4 illustrates an exhaust heat collecting and cooling system included in a conventional substrate processing apparatus 100.

In a reaction container 202 of the conventional substrate processing apparatus, various films are formed using heat energy. Thus, in a series of processes performed to form a thin film, heat collected or exhausted from various members that constitute the reaction container 202 is discharged into a clean room CR or the atmosphere.

For example, a rapid cooling process is performed between a treatment process and a substrate unloading process to improve the throughput. After substrate processing is performed, a heated wafer 200 and the reaction container 202 are cooled whenever a treatment is performed in an external container 10 during the rapid cooling process. That is, the reaction container 202 is cooled by introducing a cooling gas serving as a refrigerant from an opening 15 which is a refrigerant supply unit into a space 10a, which is formed as a refrigerant flow path between the external container 10 and the reaction container 202, using a blower (not shown). The cooling gas heated in the space 10a passes through a refrigerant exhaust pipe 50 serving as a refrigerant exhaust unit, and exchanges heat with cooling water in a first heat exchanger 71 to be cooled to a predetermined temperature. The cooling gas cooled to the predetermined temperature is directly discharged into the atmosphere. The cooling water used to cool the cooling gas exchanges heat with a refrigerant in a second heat exchanger 72 and is thus cooled to a predetermined temperature. The cooling water cooled with the refrigerant in the second heat exchanger 72 is directly discharged (OUT) into, for example, plant equipment.

In the substrate unloading process, a processed wafer 200 that is at a high temperature is loaded into a transfer chamber 124 from the reaction container 202, air-cooled to a case-storable temperature by a radiator 120, and then exhausted from the transfer chamber 124 directly to the clean room CR or exhaust equipment. For effective use of exhaust heat, the refrigerant used to cool the cooling water in the second heat exchanger 72 is used as a refrigerant of the radiator 120.

As described above, cooling water or an exhaust gas that retains heat energy is actually discharged into the atmosphere, the clean room CR, or the plant equipment without sufficiently extracting exhaust heat of the cooling water or the exhaust gas.

However, due to recent environmental and climatic changes, measures are being taken to save energy in plants and products, and a substrate processing apparatus is no exception. In industry, energy-saving indices of devices may be set and used as management criteria or criteria for client specifications. Accordingly, as energy needs to be processed at a predetermined level, a flow rate of cooling water or exhaust air has reduced to secure system performance and safety. However, reduction to the flow rate of the cooling water or the exhaust air is limited. Thus, in order to more efficiently advance energy-saving measures, exhaust heat discharged from a substrate processing apparatus needs to be effectively used in some way.

Figure 3A:
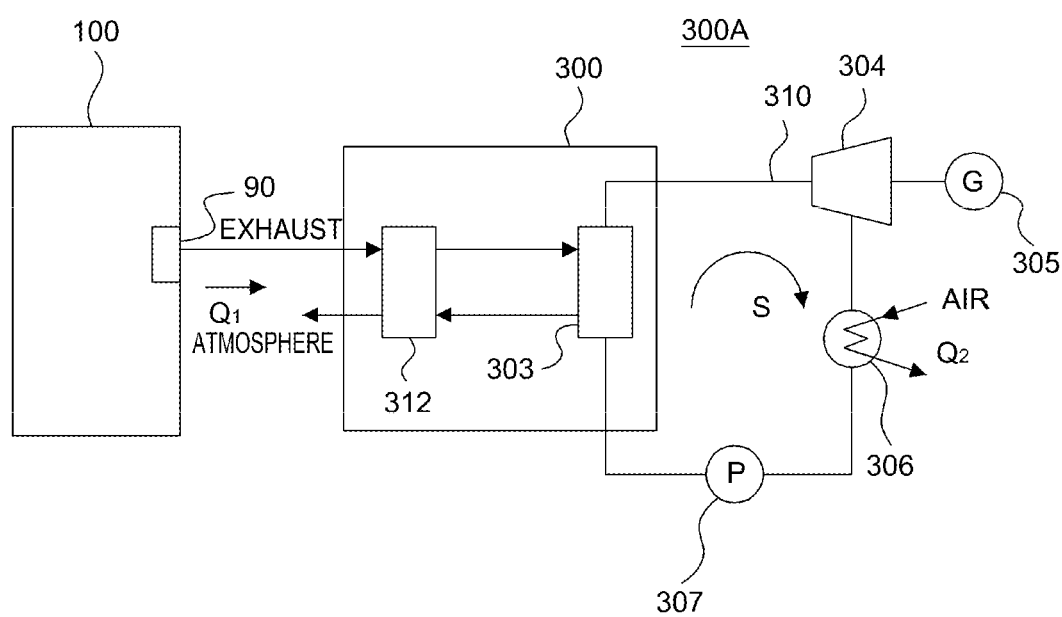
FIGS. 3A and 3B are diagrams schematically illustrating Rankine cycle devices according to embodiments of the present invention.

As illustrated in FIG. 3A, in a substrate processing apparatus 100 according to an embodiment of the present invention, a Rankine cycle device 300A is installed to generate power from exhaust heat of a refrigerant exhausted via an exhaust unit 90 of the substrate processing apparatus 100.

In the substrate processing apparatus 100 including the Rankine cycle device 300A, a heat exchanger 300 serving as a vaporizer, a vapor turbine 304 serving as an expander (turbine), a cooler 306 serving as a condenser, a working medium pump 307 serving as a supply pump, a working medium path 310 connecting these devices, and a generator 305 are included. Thermally, heat Q1 from the substrate processing apparatus 100 is delivered to the heat exchanger 300 in the form of an exhaust gas, and heat Q2 is discharged from the cooler 306 through the medium of air.

The substrate processing apparatus 100 according to the present embodiment is applicable to a reaction chamber or a high-temperature substrate processing apparatus. The substrate processing apparatus 100 may be a vertical-type apparatus or a single-wafer type apparatus but is preferably a hot-wall type processing apparatus. The substrate processing apparatus 100 is more preferably a vertical-type apparatus that includes a large-sized reaction container. Also, the substrate processing apparatus 100 is applicable to a gas cleaning apparatus, e.g., a combustion pre-treatment apparatus. Thus, when the term 'substrate processing apparatus' is used in the present disclosure, it should be understood as including a gas cleaning apparatus.

In the case of a substrate processing apparatus, any object heated to a high temperature, e.g., a heating unit (heater) installed outside a reaction container, a heated reaction container, a heated substrate, or a refrigerant (a gas, cooling water, etc.) for cooling a reaction container or a reaction container member, may be used as a heat source of a Rankine cycle. Also, in the case of a combustion pre-treatment apparatus, a combustion tube, a heated clean gas discharged from the combustion tube, or the like may be used as the heat source of the Rankine cycle.

A refrigerant flow path passing the exhaust unit 90 is installed such that an applicable member, i.e., a member that may be used as a heat source of the Rankine cycle of the substrate processing apparatus, is disposed in the refrigerant flow path. The member is preferably heated to a high temperature. According to an embodiment, the reaction container 202 of the substrate processing apparatus may be included in the reaction chamber in which the refrigerant flow path is installed. Here, the reaction container 202 includes a reaction tube 205 and a heater 207 serving as a heating unit. The reaction container 202 may include the reaction tube 205 and a manifold. The reaction chamber is formed in the reaction container 202 in which the reaction tube 205 and the manifold are piled up in a vertical direction. Thus, in the refrigerant flow path, the heater 207 installed as a heating unit outside the reaction container 202, the heated reaction container 202 (or a reaction container member), a power source (not shown) of the heater 207, a plasma generation unit, a power source of the plasma generation unit, etc. may be included. Examples of the refrigerant may include cooling wind and cooling water.

The heat exchanger 300 is installed in the exhaust unit 90 of the substrate processing apparatus 100, and collects heat energy from a heated refrigerant. The heat energy collected by the heat exchanger 300 is transformed into power in a heat cycle. The heat cycle may be, for example, the Rankine cycle. In a semiconductor device manufacturing method using a substrate processing apparatus, heat may be collected in the Rankine cycle in a normal state, i.e., a standby state or a rapid cooling process. Also, in a cooling cycle that is reverse to the Rankine cycle, a substrate may be cooled using heat energy collected by the heat exchanger 300 when a boat is down. Through such a cooling process, a transfer chamber or a device (e.g., a sensor, a transfer robot, etc.) installed in the transfer chamber may be prevented from being heated with radiant heat radiated from the reaction chamber, a boat, or a substrate that is in a high-temperature state or with heat delivered from an atmosphere in the transfer chamber, and the device (e.g., the sensor or the transfer robot) may be prevented from malfunctioning.

In the Rankine cycle device 300A, a working medium (a refrigerant) transmitted to the working medium path 310 is heated using heat exchange. According to an embodiment, the heat exchanger 300 may be configured by a first heat exchanger 312 and a second heat exchanger 303 to improve the efficiency of heat exchange. The first heat exchanger 312 cools an exhaust gas by heat-exchanging the exhaust gas with cyclic cooling water. The cooled exhaust gas is directly discharged into the atmosphere. The second heat exchanger 303 heats and vaporizes the working medium by heat-exchanging the working medium with heated cooling water.

The vapor turbine 304 is driven by the vaporized working medium supplied from the heat exchanger 300. The generator 305 is driven by the vapor turbine 304. The cooler 306 cools the working medium used to drive the vapor turbine 304. The working medium pump 307 delivers the cooled working medium to the heat exchanger 300, thereby circulating the working medium in the working medium path 310.

A refrigerant serving as the working medium circulating in the working medium path 310 is vaporized into high-temperature and pressure vapor by the heat exchanger 300. The vaporized refrigerant serving as the working medium causes the vapor turbine 304 to rotate, thereby mechanically generating electric energy. The generated electric energy is used to, for example, mainly or auxiliary drive the substrate processing apparatus 100. The vaporized refrigerant serving as the working medium which causes the vapor turbine 304 to rotate is air-cooled by the cooler 306. The cooled refrigerant serving as the working medium flows in the working medium path 310 in a direction indicated by an arrow S through the working medium pump 307 and is then transmitted to the heat exchanger 300.

In general, alternative Freon R-134 that is easy to put into water and to be switched between a liquid state and a gaseous state is used as the working medium in the Rankine cycle. In addition to the alternative Freon R-134, a medium capable of further improving the efficiency of power generation, for example, ammonia (boiling point: −33° C., gas density: 0.77 kg/m$^3$), propane (boiling point: −42° C., gas density: 2.0 kg/m$^3$), Freon (boiling point: −23° C., gas density: 5 kg/m$^3$), alternative Freon R-134 (boiling point: −26.2° C., gas density: 32.4 kg/m$^3$), carbon dioxide (boiling point: −78.5° C., gas density: 1.98 kg/m$^3$), etc. which have low boiling points and high gas densities may be used as the working medium in the Rankine cycle. However, ammonia is likely to erode devices, propane is likely to explode, and Freon has a high environmental load. Thus, alternative Freon R-134 is preferable in consideration of the durability or the efficiency of power generation of a material of the working medium path in which the working medium flows.

The substrate processing apparatus according to the present embodiment is capable of efficiently generating power from heat of the reaction chamber and heat of a heated substrate. Also, some of exhaust heat discharged from the substrate processing apparatus 100 is directly discharged into the atmosphere, but the remaining exhaust heat may be efficiently collected by the Rankine cycle device 300A to generate power in the Rankine cycle. The generated power may be used as power of the substrate processing apparatus 100, thereby saving energy of the substrate processing apparatus 100.

Figure 3B:
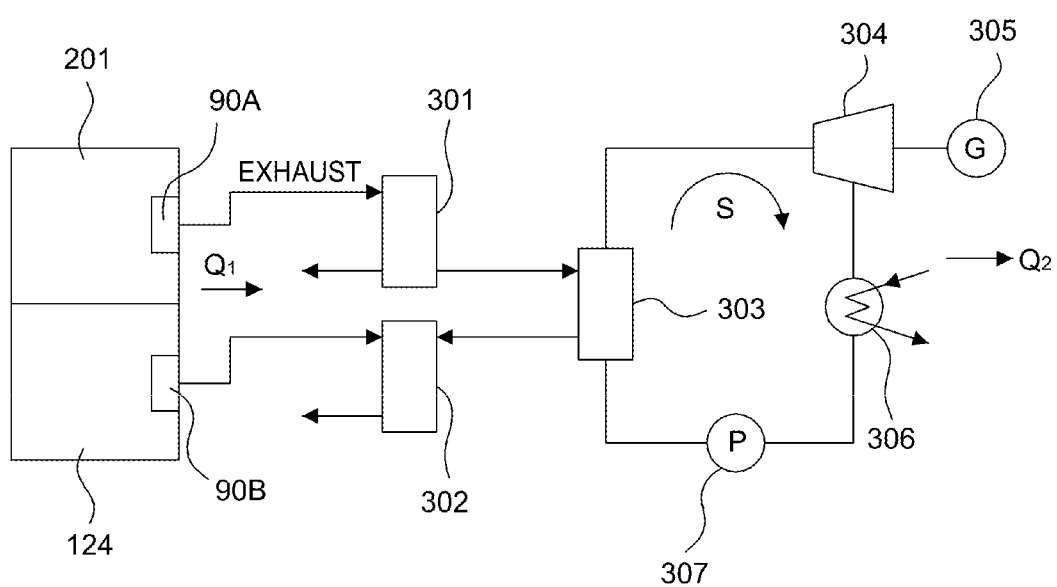

As illustrated in FIG. 3B, according to another embodiment, the exhaust unit 90 may be divided into two systems: a refrigerant exhaust unit 90A configured to cool the reaction chamber 201 and a refrigerant exhaust unit 90B configured to cool substrates unloaded from the transfer chamber 124. In this case, the refrigerant exhaust unit 90A included in the reaction chamber 201 includes the space 10a installed as the refrigerant flow path in the reaction chamber 201, the opening 15 formed as a refrigerant supply unit to supply a refrigerant to the refrigerant flow path, and the refrigerant exhaust pipe 50 installed as a refrigerant exhaust unit to exhaust a heated refrigerant from the refrigerant flow path which are described above with reference to FIG. 4. Also, the refrigerant exhaust unit 90B included in the transfer chamber 124 mainly includes a clean filter 134a serving as a transfer chamber gas supply unit to supply a gas into the transfer chamber 124, and an exhaust device 126 serving as a transfer chamber exhaust unit to exhaust the inside of the transfer chamber 124. The gas supplied into the transfer chamber 124 is preferably an inert gas that does not react with a substrate or a film formed on the substrate. The transfer chamber gas supply unit and the transfer chamber exhaust unit will be hereinafter referred to as an inert gas supply unit and an inert gas exhaust unit, respectively, when an inert gas is processed in the transfer chamber gas supply unit and the transfer chamber exhaust unit.

In this case, the first heat exchanger 312 is divided into two parts: a heat exchanger 301 and a heat exchanger 302. The heat exchanger 301 of the one side is configured to cool an exhaust gas from the reaction chamber 201. The heat exchanger 302 of the other side, e.g., a radiator, is configured to cool the heated exhaust gas by cooling the wafer 200 in the transfer chamber 124.

A semiconductor device manufacturing method performed by the substrate processing apparatus 100 including the 2-system exhaust unit 90 (including the refrigerant exhaust units 90A and 90B) illustrated in FIG. 3B includes a substrate loading process, a substrate processing process, a rapid substrate cooling process, and a substrate unloading process.

In the substrate loading process, a transfer unit installed in the transfer chamber 124 configured to accommodate a transferred substrate transfers the substrate into the reaction chamber 201. The substrate processing process includes a step of heating the substrate using the heating unit, a step of supplying a process gas into the reaction chamber 201 using a first gas supply unit, and a step of exhausting the inside of the reaction chamber 201 using the refrigerant exhaust unit 90A. The rapid substrate cooling process includes a step of supplying a refrigerant into the space 10a which is a refrigerant flow path formed in the reaction chamber 201 via the opening 15 serving as a refrigerant supply unit after the substrate processing process, and a step of exhausting the refrigerant from the refrigerant flow path by the refrigerant exhaust pipe 50 which is a refrigerant exhaust unit. The substrate unloading process includes a step of supplying a gas into the transfer chamber 124 by a second gas supply unit, a step of exhausting the inside of the transfer chamber 124 by the refrigerant exhaust unit 90B, and a step of transferring the substrate from the reaction chamber 201 to the transfer chamber 124 by the transfer unit.

The rapid substrate cooling process includes a step of heating a working medium by collecting heat from a gas exhausted from the refrigerant exhaust unit 90A by the heat exchanger 300 (the first and second heat exchangers 301 and 303) installed in the refrigerant exhaust unit 90A, a step of driving the vapor turbine 304, which is installed in the working medium path 310 through which the working medium flows, by the heated working medium, a step of generating power by the generator 305 connected to the vapor turbine 304, a step of cooling the working medium by the cooler 306 installed in the working medium path 310, and a step of transmitting the cooled working medium to the heat exchanger 303 by the working medium pump 307 installed in the working medium path 310.

The substrate unloading process includes a step of heating the working medium by the heat exchanger 300 (the heat exchangers 302 and 303) installed in the refrigerant exhaust unit 90B, a step of driving the vapor turbine 304, which is installed in the working medium path 310 through which the working medium flows, by the working medium, a step of generating power by the generator 305 driven by the vapor turbine 304, a step of cooling the working medium discharge from the vapor turbine 304 by the cooler 306 installed in the working medium path 310, and a step of pressurizing the cooled working medium and the pressurized working medium to the heat exchanger 303 by the working medium pump 307 installed in the working medium path 310.

Accordingly, heat discharged during the rapid substrate cooling process may be efficiently collected and heat of a processed wafer when the processed wafer is rapidly cooled may be collected. Also, not only heat discharged during the substrate unloading process but also heat of the wafer when a boat is down may be collected. Thus, power may be generated from heat of a reaction chamber and heat of a heated substrate.

[First Embodiment]

A substrate processing apparatus including an exhaust heat collecting system described above according to a first embodiment of the present invention will be described below.

(Substrate Processing Apparatus)

First, a substrate processing apparatus according to the present embodiment is configured as a semiconductor manufacturing device for performing processes of a method of manufacturing a semiconductor device (integrated circuit (IC)). In the following description, a case in which a vertical-type apparatus capable of performing oxidation, a diffusion treatment, chemical vapor deposition (CVD), etc. on a substrate (hereinafter referred to simply as a 'processing apparatus') is applied as a substrate processing apparatus will be described.

Figure 6:
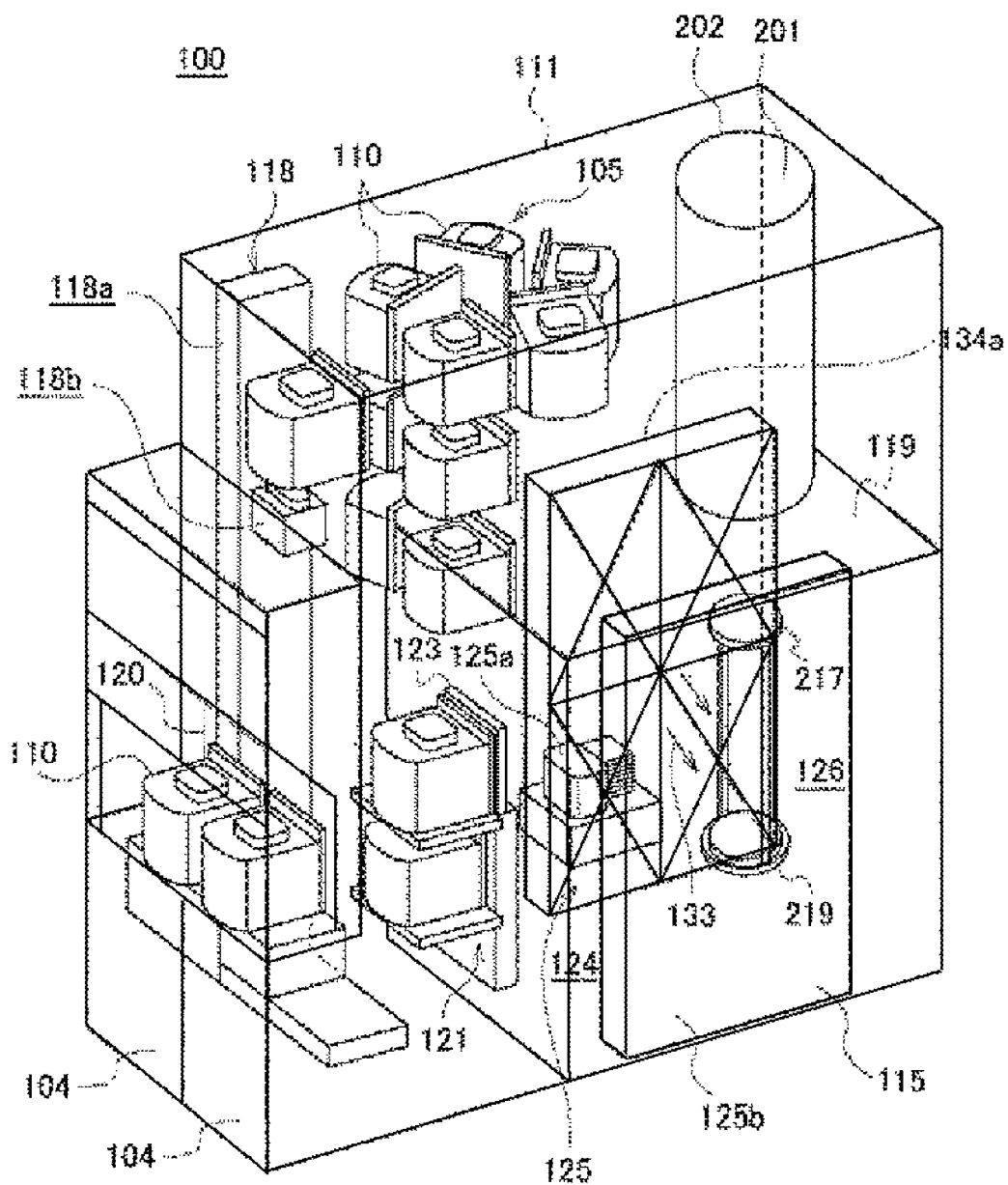
FIG. 6 is a diagram schematically illustrating a structure of a vertical-type substrate processing apparatus according to an embodiment of the present invention.
Figure 7:
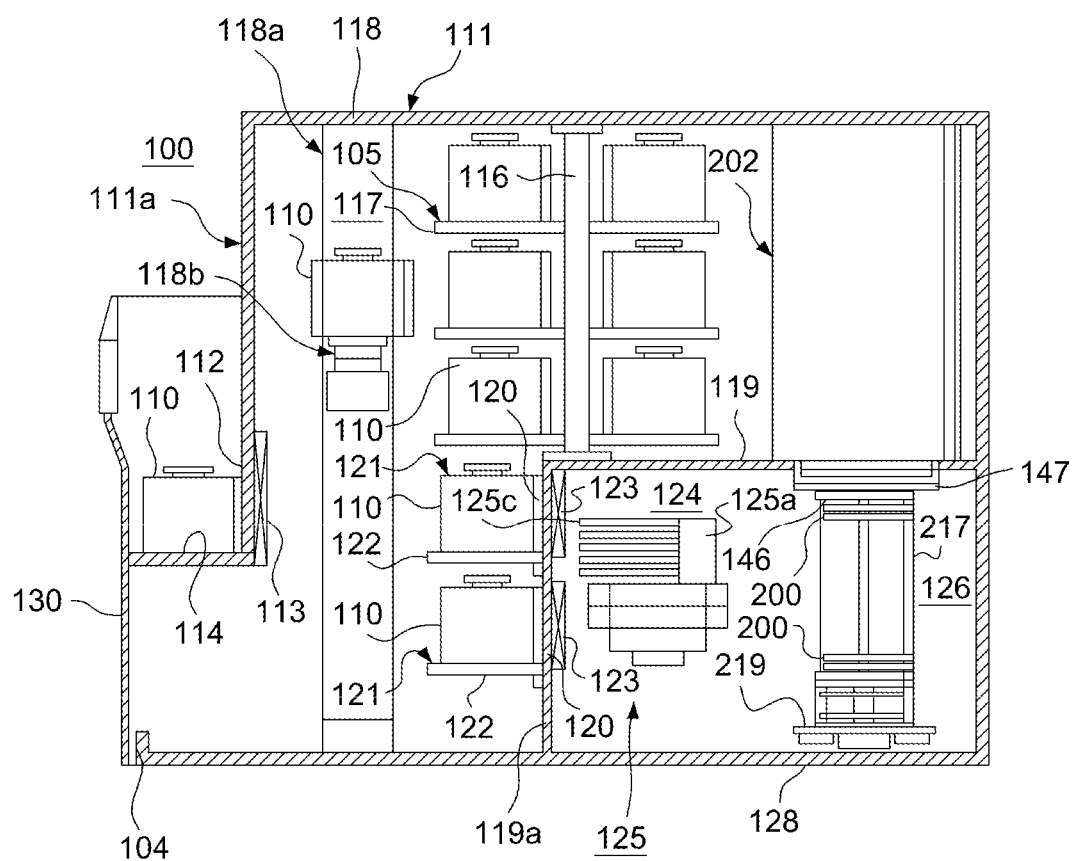
FIG. 7 is a cross-sectional view of a vertical-type substrate processing apparatus according to an embodiment of the present invention.

FIG. 6 is a diagram schematically illustrating a structure of a vertical-type substrate processing apparatus 100 (which hereinafter may also be referred to simply as a 'processing apparatus 100') according to an embodiment of the present invention and an oblique perspective view of the vertical-type substrate processing apparatus 100. FIG. 7 is a cross-sectional view of the vertical-type substrate processing apparatus 100 according to an embodiment of the present invention.

In the processing apparatus 100, cassettes 110 are used as wafer carriers of substrates 200 formed of silicon and so on (hereinafter referred to as 'wafers 200'). Below a front wall 111a of a housing 111 of the processing apparatus 100, a front maintenance port (not shown) is installed as an opening through which maintenance may be performed. A front maintenance door 104 is installed at the front maintenance port to open/close the front maintenance port.

At the front maintenance door 104, a cassette loading/unloading port (substrate container loading/unloading port) 112 is installed such that the inside and outside the housing 111 communicate. The cassette loading/unloading port 112 is opened/closed by a front shutter (substrate container loading/unloading port opening/closing unit) 113. A cassette stage (substrate container receiving/delivery platform) 114 is installed at an inner side of the cassette loading/unloading port 112 of the housing 111. The cassettes 110 are configured to be loaded on the cassette stage 114 and unloaded from the cassette stage 114 by an in-process transfer device (not shown).

The cassette stage 114 is placed by the in-process transfer device such that the wafers 200 are placed in the cassettes 110 in a vertical posture and the wafer entrances of the cassettes 110 are placed upward. The cassette stage 114 is configured to rotate the cassettes 110 90° clockwise in a vertical direction at the back of the housing 111, so that the wafers 200 in the cassettes 110 may be placed in a horizontal posture to turn the wafer entrances of the cassettes 110 to face the back of the housing 111.

A cassette shelf (substrate container shelf) 105 is installed at a roughly central portion of the housing 111 in a front-back direction. The cassette shelf 105 is configured to store the cassettes 110 in columns and rows. In the cassette shelf 105, transfer shelves 122 are installed to accommodate the cassettes 110 to be transferred by a wafer transfer mechanism 125. Also, a spare cassette shelf 107 is installed above the cassette stage 114 and configured to store spare cassettes 110. A cassette transfer unit (substrate container transfer device) 118 is installed between the cassette stage 114 and the cassette shelf 105.

The cassette transfer unit 118 includes a cassette elevator (substrate container lifting unit) 118a configured to move upward/downward while retaining the cassettes 110 and a cassette transfer unit (substrate container transfer unit) 118b serving as a transfer unit, and is configured to transfer the cassettes 119 between the cassette stage 114, the cassette shelf 105, and the spare cassette shelf 107 by continuously operating the cassette elevator 118a and the cassette transfer unit 118b.

The wafer transfer mechanism (substrate carrier) 125 is installed at the back of the cassette shelf 105. The wafer transfer mechanism 125 includes a wafer transfer device (substrate carrying device) 125a configured to horizontally rotate or linearly move the wafers 200, and a wafer transfer device elevator (substrate carrying device lifting unit) 125b configured to move the wafer transfer device 125a upward/downward. The wafer transfer device elevator 125b is installed at a right end of the housing 111 which is pressure-resistant. By continuously operating the wafer transfer device elevator 125b and the wafer transfer device 125a, the wafers 200 are loaded (charged) in a boat (substrate retainer) 217 and unloaded (discharged) from the boat 217 using tweezers (substrate retaining element) 125c of the wafer transfer device 125a as a wafer placing unit of the wafers 200.

A reaction container 202 is installed in an upper rear portion of the housing 111. A lower end portion of the reaction container 202 is configured to be opened/closed by a furnace port shutter (furnace port opening/closing unit) 147. A boat elevator (substrate retainer lifting unit) 115 serving as a unit for lifting the boat 217 to the reaction container 202 is installed below the reaction container 202. A seal cap 219 serving as a lid is horizontally installed on a lifting arm 128 serving as a connector connected to a lifting platform of the boat elevator 115. The seal cap 219 is configured to vertically support the boat 217 and block the lower end portion of the reaction container 202.

The boat 217 includes a plurality of retainers, and is configured to retain a plurality of wafers 200 (e.g., about 50 to 150 wafers 200) in a horizontal posture in a state in which the plurality of wafers 200 are vertically arranged in a concentric form.

A cleaning unit 134a that includes a supply fan and a dustproof filter to supply clean air 133 is installed at a left end portion of the housing 111 opposite to the wafer transfer device elevator 125b and the boat elevator 115. The clean air 133 discharged from the cleaning unit 134a circulates into the wafer transfer device 125a and the boat 217, is inhaled in an exhaust device (not shown), and is then exhausted to the outside of the housing 111. The transfer chamber gas supply unit is mainly configured by the cleaning unit 134a. Further, the transfer chamber exhaust unit is mainly configured by the exhaust device.

Next, an operation of the processing apparatus 100 will be described with reference to FIGS. 6 and 7.

Before the cassettes 110 are supplied to the cassette stage 114, the cassette loading/unloading port 112 is opened by the front shutter 113. Then, the cassettes 110 are loaded from the cassette loading/unloading port 112, and placed on the cassette stage 114 such that the wafers 200 are arranged in a vertical posture and the wafer entrances of the cassettes 110 face upward. Then, the wafers 200 in the cassettes 110 may be placed in a horizontal posture by the cassette stage 114, and the cassettes 110 may be rotated 90° clockwise with respect to the back of the housing 111 such that the wafer entrances of the cassettes 110 face the back of the housing 111.

Next, the cassettes 110 are automatically transferred by the cassette transfer unit 118 onto predetermined locations on the cassette shelf 105 or the spare cassette shelf 107, temporarily stored at the predetermined locations, and carried on the transfer shelves 122 from the cassette shelf 105 or the spare cassette shelf 107 by the cassette transfer unit 118 or directly transferred to the transfer shelves 122.

When the cassettes 110 are carried on the transfer shelves 122, one of the wafers 200 is picked up from one of the cassettes 110 by the tweezers 125c of the wafer transfer device 125a via the wafer entrance of the cassette 110, and loaded (charged) in the boat 217 at the back of the transfer chamber 124. After the wafer 200 is loaded in the boat 217, the wafer transfer device 125a returns to the cassettes 110 and loads another wafer 200 in the boat 217.

When a predetermined number of wafers 200 are loaded in the boat 217, the lower end portion (furnace port) of the reaction container 202 closed by the furnace port shutter 147 is opened by the furnace port shutter 147. Thereafter, the boat 217 retaining the predetermined number of wafers 200 is carried (loaded) into the reaction chamber 201 in the reaction container 202 when the seal cap 219 is lifted by the lifting arm 128 of the boat elevator 115.

After the boat 217 is loaded into the reaction chamber 20, an arbitrary treatment is performed on the wafers 200 in the reaction container 202. After this treatment is performed, the wafers 200 and the cassettes 110 are unloaded to the outside of the housing 111 in an order reverse to the above-described order.

In a substrate processing apparatus according to the present embodiment, power is generated from either heat of a reaction container or heat of a substrate heated during a rapid cooling process after substrate processing is performed, or heat of an exhaust gas heated by a boat. Also, power is generated from clean air heated by a heated substrate or the heated boat when the boat is down after substrate processing is performed as described above.

(Reaction Container)

Figure 5:
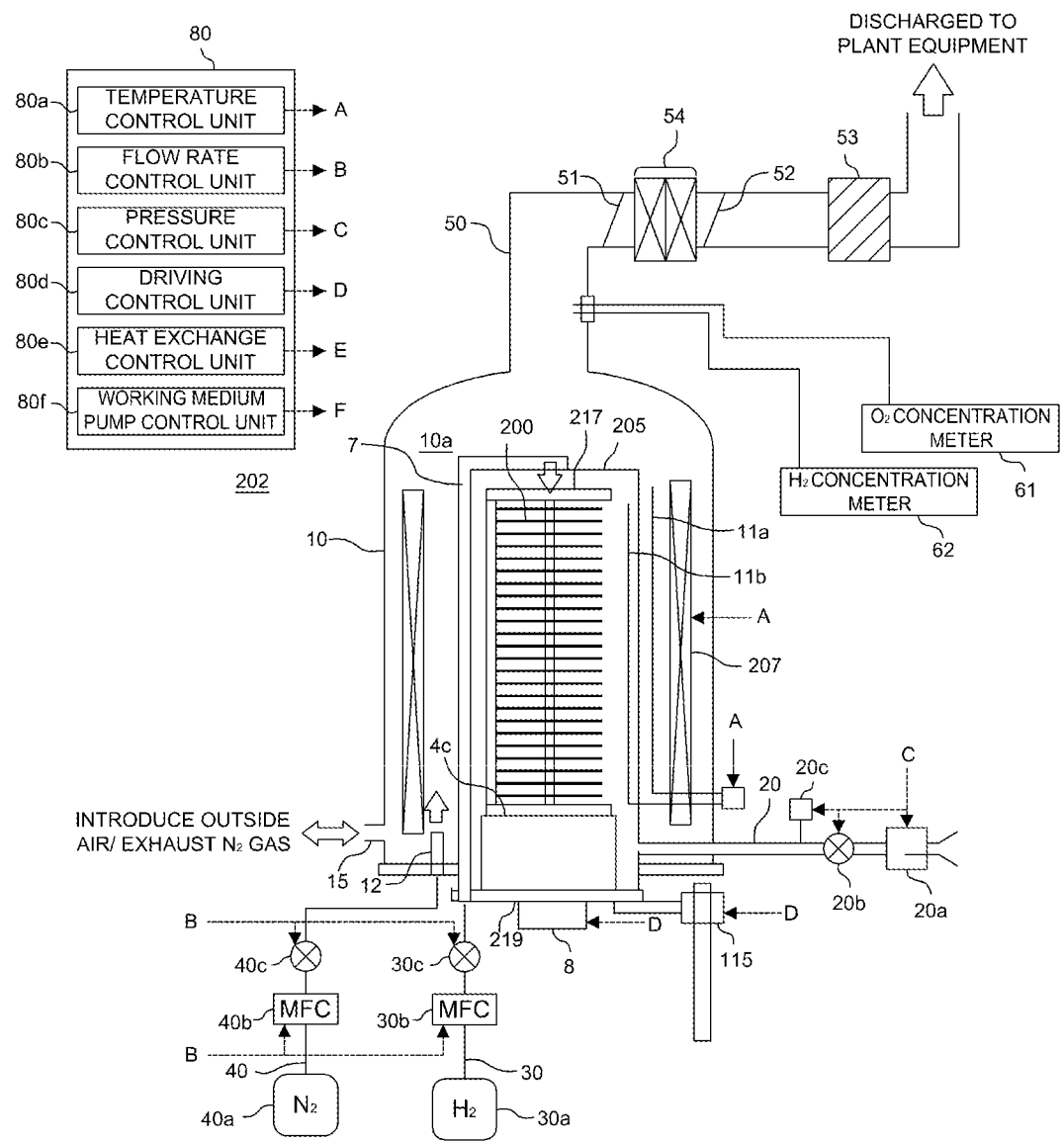
FIG. 5 is a diagram schematically illustrating a structure of a reaction container of a substrate processing apparatus according to an embodiment of the present invention.

A schematic structure of a reaction container 202 of a substrate processing apparatus 100 according to the present embodiment will be described with reference to FIG. 5 below. FIG. 5 is a diagram schematically illustrating a structure of the reaction container 202 in which a longitudinal cross-sectional view of the reaction container 202 is shown.

As illustrated in FIG. 5, the substrate processing apparatus 100 according to the present embodiment includes a reaction tube 205 in which wafers 200 are accommodated. The reaction tube 205 is formed of a non-metal heat-resistance material such as quartz ($SiO_2$) or silicon carbide (SiC), and has a cylindrical shape, the upper end of which is closed and the lower end of which is open. In the reaction tube 205, a reaction chamber 201 is formed. The reaction chamber 201 is formed to accommodate the wafers 200 such that the wafers 200 are vertically stacked in a horizontal posture in a multi-layer structure by a boat 217 which will be described below.

Below the reaction tube 205, a seal cap 219 is installed as a furnace port lid. The seal cap 219 is formed of, for example, a metal such as stainless steel and has a disk shape. The seal cap 219 is configured to be moved upward/downward by a boat elevator 115, and to air-tightly move a lower end portion of the reaction tube 205 via an O-ring (not shown) when the seal cap 219 is moved upward. A rotating mechanism 8 that rotates the boat 217 which will be described below is installed around a lower central portion of the seal cap 219. A rotation shaft (not shown) of the rotating mechanism 8 is connected to a lower end portion of an insulation container 4c installed on the seal cap 219 while passing through the seal cap 219. The insulation container 4c is formed, for example, of a non-metal heat-resistance material such as quartz or silicon carbide, and has a disk shape. The insulation container 4c supports the boat 217 from below. The boat 217 is formed, for example, of a non-metal heat-resistance material such as quartz or silicon carbide, and configured to retain a plurality of wafers 200 (e.g., about 50 to 200 wafers 200) in a state in which the wafers 200 are vertically stacked in a horizontal posture in a multilayer structure.

An upstream end of an exhaust pipe 20 is connected to a lower portion of a sidewall of the reaction tube 205. At the exhaust pipe 20, a pressure sensor 20c, an auto pressure controller (APC) valve 20b, and a vacuum pump 20a are sequentially installed in an upstream direction. A first gas exhaust unit that exhausts an atmosphere in the reaction tube 205 (in the reaction chamber 201) mainly includes the exhaust pipe 20, the pressure sensor 20c, and the APC valve 20b. The first gas exhaust unit may further include the vacuum pump 20a.

(Process Gas Supply Unit)

A process gas introduction nozzle 7 is installed on a sidewall of the reaction tube 205 to extend from the bottom of the reaction tube 205 to the top thereof. A downstream end of the process gas introduction nozzle 7 opens in a ceiling portion of the reaction tube 205. A downstream end of the process gas supply pipe 30 is connected to an upstream end of the process gas introduction nozzle 7. At the process gas supply pipe 30, a process gas source 30a that supplies hydrogen ($H_2$) gas, a mass flow controller 30b serving as a flow rate control unit, and an opening/closing valve 30c are sequentially installed in the upstream direction. The $H_2$ gas may be supplied into the reaction chamber 201 from the process gas source 30a via the process gas introduction nozzle 7 and the ceiling portion of the reaction tube 205 by opening the opening/closing valve 30c while adjusting a flow rate of the $H_2$ gas by the mass flow controller 30b. A process gas supply unit mainly includes the process gas introduction nozzle 7, the process gas supply pipe 30, the mass flow controller 30b, and the opening/closing valve 30c. The process gas supply unit may further include the process gas source 30a. A gas supply unit mainly includes the process gas introduction nozzle 7 described above. Also, a cylinder or storage equipment that supplies hydrogen ($H_2$) gas, nitrogen ($N_2$) gas, oxygen ($O_2$) gas, argon (Ar) gas, a carbon atom-containing gas, etc. may be installed in the process gas source.

(Heater)

A heater 207 serving as a heating unit to heat the wafers 200 via sidewalls of the reaction tube 205 is installed outside the reaction tube 205. The heater 207 has a cylindrical shape surrounding the outer circumference of the reaction tube 205 in a concentric form. The heater 207 is configured, for example, as a heater using electric current heating. Also, the reaction tube 205 according to the present embodiment is configured as a single pipe as described above, and thus greater responsivity of temperature control in the reaction tube 205 (or on the wafers 200) using the heater 207 can be secured than in a conventional substrate processing apparatus including a reaction container having a double pipe structure.

(External Container)

An external container 10 configured to accommodate the reaction tube 205 and the heater 207 is installed along the outer circumference of the heater 207. The external container 10 is installed to surround the outer circumference of the heater 207 in a concentric form, and has a disk shape. An upper end of the external container 10 is blocked and a lower end thereof is air-tightly encapsulated. A ventilation port 15 is installed as a refrigerant supply unit in a lower portion of a sidewall of the external container 10 to communicate inside/outside the external container 10.

(Inert Gas Supply Unit)

An inert gas introduction nozzle 12 is installed at the bottom of the external container 10. The inert gas introduction nozzle 12 is vertically installed. At a downstream end of the inert gas introduction nozzle 12, a gas supply port which is a lower end of a space between the external container 10 and the reaction tube 205 is installed to discharge an inert gas (a purge gas), e.g., nitrogen ($N_2$) gas, between the heater 207 and the reaction tube 205. A downstream end of an inert gas supply pipe 40 is connected to an upstream end of the inert gas introduction nozzle 12. At the inert gas supply pipe 40, an inert gas source 40a that supplies nitrogen ($N_2$) gas, a mass flow controller 40b serving as a flow rate control unit, and an opening/closing valve 40c are sequentially installed in the upstream direction. The nitrogen ($N_2$) gas supplied from the inert gas source 40a may be supplied into the space 10a between the external container 10 and the reaction tube 205 via the inert gas introduction nozzle 12 by opening the opening/closing valve 30c while adjusting the flow rate of the nitrogen ($N_2$) gas by the mass flow controller 40b. The inert gas supply unit mainly includes the inert gas introduction nozzle 12, the inert gas supply pipe 40, the mass flow controller 40b, and the opening/closing valve 40c. The inert gas supply unit may further include the inert gas source 40a.

(Exhaust Unit)

An upstream end of the refrigerant exhaust pipe 50 serving as a refrigerant exhaust unit is installed at an upper end of the external container 10. A shutter 51, a radiator 54 that cools an exhaust gas flowing in the refrigerant exhaust pipe 50, a shutter 52, and a blower 53 that causes the exhaust gas to flow from an upstream side of the refrigerant exhaust pipe 50 to a downstream side of the refrigerant exhaust pipe 50 are sequentially connected to the refrigerant exhaust pipe 50 in the upstream direction. An exhaust unit that exhausts an atmosphere in the space 10a between the external container 10 and the reaction tube 205 is mainly configured by the refrigerant exhaust pipe 50, the shutter 51, the radiator 54, the shutter 52, and the blower 53. By opening the shutters 51 and 52 while the blower 53 is operated, outside air (atmosphere) may be introduced into the external container 10 from the ventilation port 15 installed on the lower portion of the sidewall of the external container 10 and be circulated upward from the bottom of the external container 10 to rapidly cool (air-cool) the reaction tube 205. Also, $N_2$ gas may be introduced into the reaction tube 205 to fill the reaction tube 205 with the $N_2$ gas and the space 10a between the external container 10 and the reaction tube 205 may be purged with the $N_2$ gas by opening the opening/closing valve 30c while adjusting the flow rate of the $N_2$ gas using the mass flow controller 40b in a state in which the shutters 51 and 52 are closed. Thus, an oxygen concentration in the space 10a between the external container 10 and the reaction tube 205 may be lowered, and oxygen and hydrogen may be suppressed from reacting with each other when hydrogen gas leaks into the space 10a between the external container 10 and the reaction tube 205. Also, the $N_2$ gas used to purge the space 10a is discharged to the outside of the external container 10 via the ventilation port 15. Also, a refrigerant exhaust unit may include the shutter 51, the radiator 54, the shutter 52, and the blower 53.

A refrigerant flow path mainly includes the space 10a, the refrigerant exhaust pipe 50, the shutter 51, the radiator 54, the shutter 52, and the blower 53 which are described above. A refrigerant supply unit mainly includes the ventilation port 15. A refrigerant exhaust unit mainly includes the refrigerant exhaust pipe 50 installed at a downstream side of the blower 53.

(Temperature Measuring Unit)

A heater thermocouple 11a serving as a temperature measuring unit to measure a temperature in the space 10a between the external container 10 and the reaction tube 205 is installed in a space between the heater 207 and an outer wall of the reaction tube 205. A cascade thermocouple 11b that measures a temperature of the reaction chamber 201 is installed between a space between an inner wall of the reaction tube 205 and the wafers 200.

(Control Unit)

Figure 11:
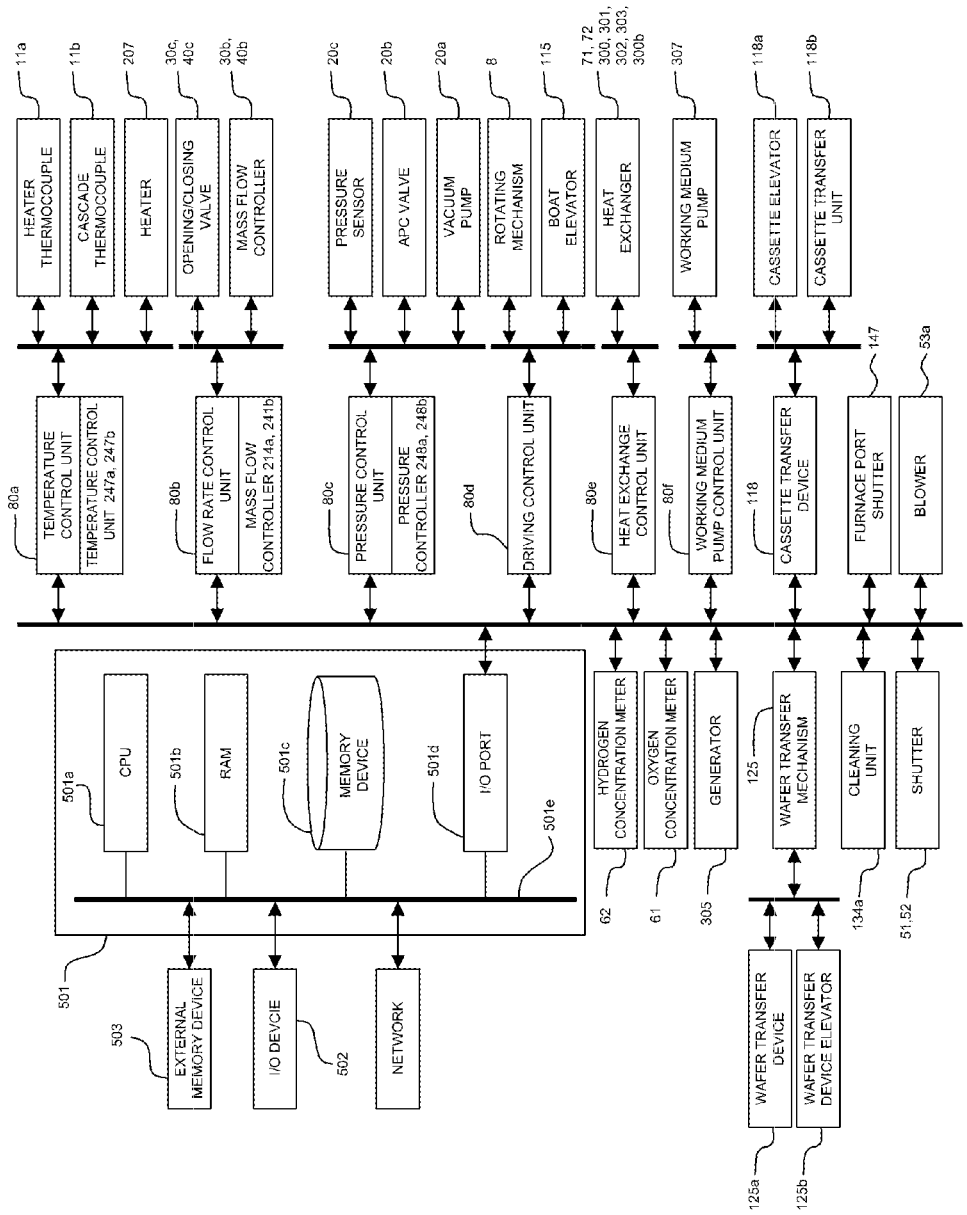
FIG. 11 is a diagram illustrating a structure of a controller according to an embodiment of the present invention.

As illustrated in FIG. 11, a substrate processing apparatus according to the present embodiment includes a main controller 501 as a control unit for controlling the operations of the various elements of the substrate processing apparatus described above or various control units which will be described below. The main controller 501 is configured as a computer that includes a central processing unit (CPU) 501a, a random access memory (RAM) 501b, a memory device 501c, and an input/output (I/O) port 501d. The RAM 501b, the memory device 501c, and the I/O port 501d are configured to exchange data with the CPU 501a via an internal bus 501e. An I/O device 502 is connected to the main controller 501 embodied, for example, by a touch panel or the like.

The memory device 501c is configured, for example, as a flash memory, a hard disk drive (HDD), or the like. In the memory device 501c, either a control program for controlling an operation of the substrate processing apparatus or a process recipe including an order or conditions of substrate processing which will be described below is stored to be readable. Also, the process recipe is a combination of sequences of a substrate processing process which will be described below to obtain a desired result when the sequences are performed by the main controller 501, and acts as a program. Hereinafter, the process recipe, the control program, etc. will also be referred to together simply as a 'program.' Also, when the term 'program' is used in the present disclosure, it should be understood as including only a process recipe, only a control program, or both of the process recipe and the control program. The RAM 501b is configured as a work area in which a program or data read by the CPU 501a is temporarily retained.

The I/O port 501d is connected to a sub controller, such as a temperature control unit 80a, a flow rate control unit 80b, a pressure control unit 80c, a driving control unit 80d, a heat exchange control unit 80e, and a working medium pump control unit 80f. Furthermore, the I/O port 501d is connected to a hydrogen concentration meter 62, an oxygen concentration meter 61, a generator 305, a cassette transfer unit 118, a wafer transfer mechanism 125, a cleaning unit 134a, a furnace port shutter 147, a blower 53, shutters 51 and 52, etc. The temperature control unit 80a is connected to a heater thermocouple 11a, a cascade thermocouple 11b, and a heater 207, and configured to control a temperature of the heater 207 at a predetermined timing, based on a temperature measured by the heater thermocouple 11a and the cascade thermocouple 11b. The flow rate control unit 80b is connected to opening/closing valves 30c and 40c and mass flow controllers 30b and 40b, and is configured to suspend supply of hydrogen gas or nitrogen gas into the reaction tube 205 or to control the supply flow rate of the hydrogen gas or the nitrogen gas at a predetermined timing. The pressure control unit 80c is connected to a pressure sensor 20c, an APC valve 20b, and a vacuum pump 20a, and configured to control the degree of opening the APC valve 20b or an operation of the vacuum pump 20a at a predetermined timing based on pressure measured by the pressure sensor 20c. The driving control unit 80d is connected to a rotating mechanism 8 and a boat elevator 115, and configured to control operations of the rotating mechanism 8 and the boat elevator 115 at a predetermined timing. The heat exchange control unit (heat exchange control unit) 80e and the working medium pump control unit (pump control unit) 80f will be described with respect to collecting exhaust heat below.

Also, the main controller 501 is configured to control the inert gas supply unit to start supplying nitrogen ($N_2$) gas; control the hydrogen concentration meter 62, the oxygen concentration meter 61, and the heater thermocouple 11a to perform measurement; and control heating by the heater 207, supply of hydrogen gas by the process gas supply unit, and exhausting of the hydrogen gas by the exhaust unit based on at least two results among the results of measurement performed by the hydrogen concentration meter 62, the oxygen concentration meter 61, and the heater thermocouple 11a. Thus, hydrogen gas may be suppressed from leaking from the inside of the reaction tube 205 into the air, thereby improving safety.

The CPU 501a is configured to read and execute a control program from the memory device 501c, and to read a process recipe from the memory device 501c according to a manipulation command input from the I/O device 502. Also, based on the read process recipe, the CPU 501a is configured to control a temperature using the temperature control unit 80a, control gas flow rates using the flow rate control unit 80b, control the degree of pressure using the pressure control unit 80c, control rotation or upward/downward movement of the boat 217 using the driving control unit 80d, control heat exchange using the heat exchange control unit 80e, control supply of a working medium using the working medium pump control unit 80f, control measurement of a hydrogen concentration using the hydrogen concentration meter 62, control an oxygen concentration using the oxygen concentration meter 61, etc.

The main controller 501 is not limited to a dedicated computer and may be configured as a general-purpose computer. For example, the main controller 501 according to the present embodiment may be configured by preparing an external memory device 503 storing a program as described above [e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.)], and then installing the program in a general-purpose computer using the external memory device 503. Also, means for supplying a program to a computer are not limited to using the external memory device 503. For example, a program may be supplied to a computer using communication means, e.g., the Internet or an exclusive line, without using the external memory device 503. The memory device 501c or the external memory device 503 may be configured as a non-transitory computer-readable recording medium. Hereinafter, the memory device 501c and the external memory device 503 may also be referred to together simply as a 'recording medium.' Also, when the term 'recording medium' is used in the present disclosure, it may be understood as only the memory device 501c, only the external memory device 503, or both the memory device 501c and the external memory device 530.

In the substrate processing apparatus according to the present embodiment described above, exhaust heat of the reaction chamber 201 exhausted via the refrigerant exhaust pipe 50 at a downstream side of the blower 53 is used. Also, exhaust heat discharged from the transfer chamber 124 installed below the reaction chamber 201 is used.

Figure 1:
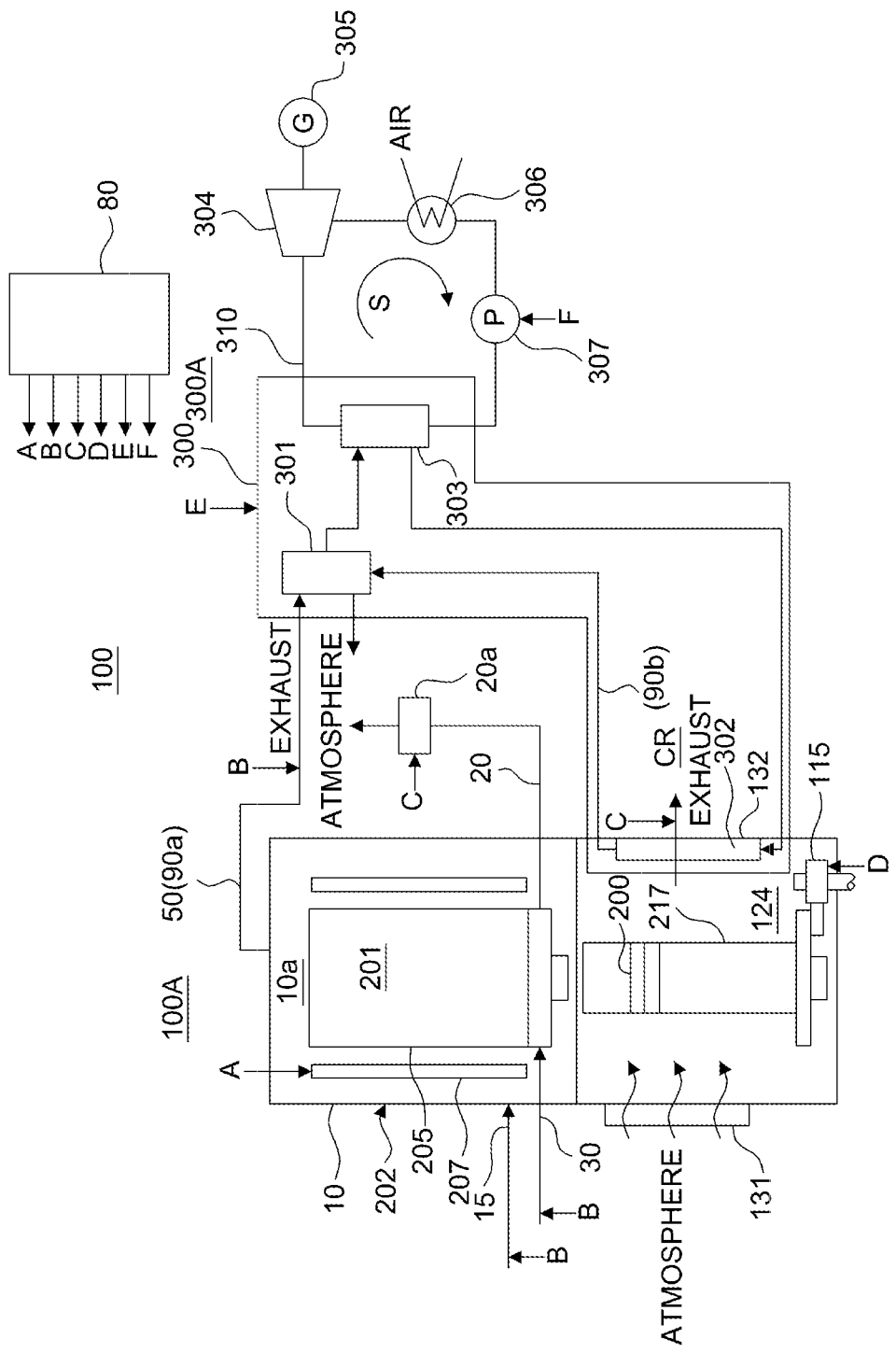
FIG. 1 is a diagram schematically illustrating a structure of a substrate processing apparatus that includes a Rankine cycle device according to an embodiment of the present invention.

FIG. 1 is a diagram schematically illustrating a structure of a substrate processing apparatus that includes the Rankine cycle device according to an embodiment of the present invention. The substrate processing apparatus 100 and the Rankine cycle device 300A have been described in detail above and will be briefly described here.

The substrate processing apparatus 100 includes a main apparatus body 100A, the Rankine cycle device 300A, and the main controller 501 serving as a control unit.

The main apparatus body 100A mainly includes a reaction chamber 201 in which wafers 200 to be processed are accommodated, a transfer chamber 124 in which the wafers 200 to be loaded in or unloaded from the transfer chamber 124 are accommodated, and a boat elevator 115 serving as a transfer unit installed in the transfer chamber 124 and configured to load the wafers 200 in or unload the wafers 200 from the reaction chamber 201.

The reaction chamber 201 is formed in a reaction container 202. The reaction container 202 includes a reaction tube 205, and a heater 207 serving as a heating unit to heat the reaction chamber 201. In the reaction container 202, a process gas supply pipe 30 which is a gas supply unit configured to supply a process gas into the reaction chamber 201, and an exhaust pipe 20 which is a gas exhaust unit configured to exhaust the inside of the reaction chamber 201 are installed.

Also, in the reaction container 202, a space 10a which is a refrigerant flow path formed between the reaction chamber 201 and an external container 10, a ventilation port 15 which is a refrigerant supply unit configured to supply a refrigerant to the space 10a which is a refrigerant flow path, and a refrigerant exhaust pipe 50 which is a refrigerant exhaust unit via which the heated refrigerant is discharged from the space 10a which is a refrigerant flow path are installed. The space 10a which is a refrigerant flow path is installed to surround the reaction chamber 201 to collect heat of a heating element. Here, examples of the heating element include the heater 207 installed in the refrigerant flow path, the reaction container 202, and the wafer 200 heated in the reaction container 202.

In the transfer chamber 124, an atmosphere ventilation port 131 which is a transfer chamber refrigerant supply unit configured to supply a gas into the transfer chamber 124, and an exhaust opening 132 which is a transfer chamber refrigerant exhaust unit configured to exhaust the inside of the transfer chamber 124 are installed.

A heat exchanger 300 is installed in the Rankine cycle device 300A. The heat exchanger 300 is installed to be connected to the refrigerant exhaust pipe 50 which is a refrigerant exhaust unit and an exhaust opening 132a which is a transfer chamber refrigerant exhaust unit, and is configured to heat a working medium, which is transmitted to a working medium path 310, through heat exchange. The heat exchanger 300 includes a first heat exchanger 312 and a second heat exchanger 303. The first heat exchanger 312 includes a heat exchanger 301 and a heat exchanger 302. The heat exchanger 301 and the heat exchanger 302 commonly use cyclic cooling water and are connected in a cascade fashion.

The heat exchanger 301 installed at the refrigerant exhaust pipe 50 of the reaction container 202 is configured to heat-exchange an exhaust gas exhausted from the refrigerant exhaust pipe 50 with cooling water to cool the exhaust gas. The cooled exhaust gas is discharged into the air. Also, the cooling water that is heat-exchanged with the exhaust gas is delivered to the second heat exchanger 303. The heat exchanger 301 may be configured as a radiator 54 installed at the refrigerant exhaust pipe 50.

The heat exchanger 302 installed at the exhaust opening 132 of the transfer chamber 124 is configured to cool the wafers 200 so that a heated exhaust gas exhausted from the exhaust opening 132 may be heat-exchanged with cooling water to be cooled. The cooled exhaust gas is discharged to a clean room CR. The cooling water that is heat-exchanged with the exhaust gas is delivered to the second heat exchanger 303 via the heat exchanger 302. The heat exchanger 302 may use a radiator installed in the transfer chamber 124.

The second heat exchanger 303 is configured to heat and vaporize a refrigerant by heat-exchanging cyclic cooling water, which is transmitted to and heated by the heat exchanger 301 of one side and the heat exchanger 302 of the other side, with the refrigerant.

Also, the Rankine cycle device 300A includes a vapor turbine 304 driven by a working medium supplied from and vaporized by the heat exchanger 300, a generator 305 driven by the vapor turbine 304, the cooler 306 for cooling the working medium used to drive the vapor turbine 304, and a working medium pump 307 for delivering the cooled working medium to the heat exchanger 300.

The heat exchange control unit 80e of FIG. 5 connected to the main controller 501 is connected to the heat exchanger 300, and configured to control a degree of heating vapor of a liquid heating medium to a predetermined temperature by boiling the liquid heating medium. The working medium pump control unit 80f is connected to the working medium pump 307, and configured to control a degree of pressurizing the liquid heating medium so that the liquid heating medium is pressurized to a predetermined level. The pressure control unit 80c is also connected to a blower 53a that constitutes a second gas exhaust unit installed in the transfer chamber 124, and configured to control a flow rate of an inert gas to be introduced into the transfer chamber 124.

[Process of Manufacturing a Semiconductor Device (Substrate Processing Process)]

Figure 9:
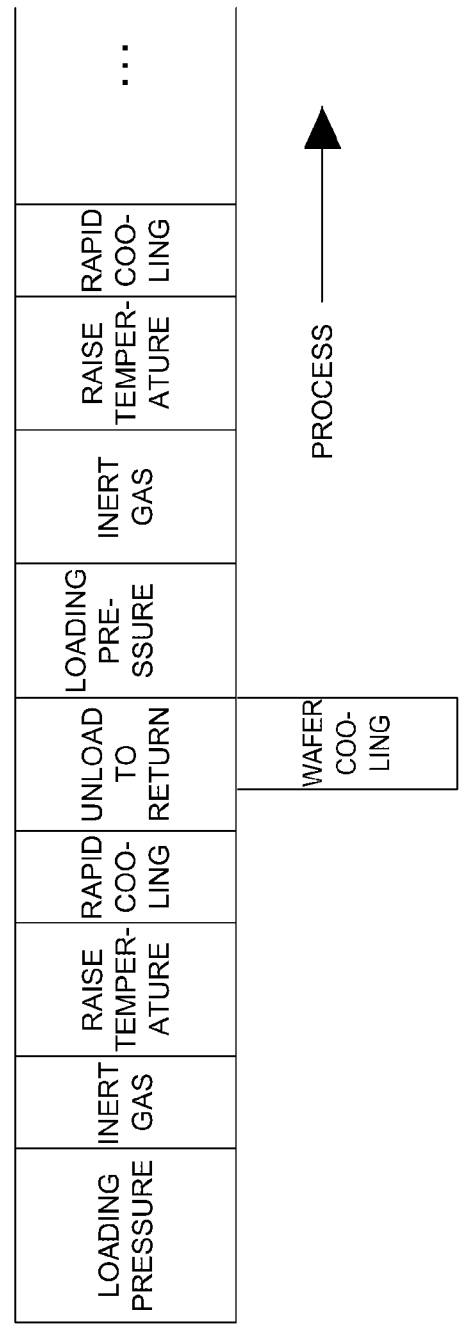
FIG. 9 is a flowchart of a substrate processing process performed to accomplish a method of manufacturing a semiconductor device according to an embodiment of the present invention.

Next, a substrate processing process performed as a process included in a process of manufacturing a semiconductor device will be described mainly with reference to FIGS. 1, 5, and 9 below. The substrate processing process will be described using a case in which after supply of hydrogen gas into the reaction tube 205 into which the wafers 200 are loaded starts, the reaction tube 205 is rapidly cooled by introducing outside air into the external container 10 while continuously supplying the hydrogen gas into the reaction tube 205. Also, in the following description, operations of the various elements of the substrate processing apparatus are controlled by the main controller 501.

(Substrate Loading Process & Pressure Adjustment Process)

First, a plurality of wafers 200 are loaded in the boat 217 (wafer charging). Then, the boat elevator 115 is operated to move the boat 217 upward to be loaded into the reaction tube 205 (into the reaction chamber 201) (boat loading). In this case, the lower end opening of the reaction tube 205 is airtightly blocked by the seal cap 219 (substrate loading process).

After the loading of the boat 217 into the reaction tube 205 (into the reaction chamber 201), the inside of the reaction chamber 201 is exhausted to have a predetermined pressure. Specifically, a degree of opening of the APC valve 20b is adjusted based on pressure measured by the pressure sensor 20c while the inside of the reaction chamber 201 is exhausted by the vacuum pump 20a (pressure adjustment process).

(Process of Supplying an Inert Gas)

Next, supply of $N_2$ gas is started by the inert gas supply unit. Specifically, the shutters 51 and 52 are closed. Then, by opening the opening/closing valve 40c while the flow rate of the $N_2$ gas is controlled by the mass flow controller 40b, the $N_2$ gas supplied from the inert gas source 40a is supplied into the space 10a between the external container 10 and the reaction tube 205 to purge the space 10a with the $N_2$ gas. Thus, an oxygen concentration in the space 10a between the external container 10 and the reaction tube 205 is lowered. Also, the $N_2$ gas used to purge the space 10a is discharged to the outside of the external container 10 via the ventilation port 15.

[Substrate Processing Process (Process Gas Supply Process)]

Next, an oxygen concentration and a hydrogen concentration are measured by the oxygen concentration meter 61 and the hydrogen concentration meter 62, respectively, and hydrogen gas is started to be supplied into the reaction tube 205. Specifically, if an oxygen concentration in the space 10a between the external container 10 and the reaction tube 205 is less than a critical concentration (e.g., 5.2%, about 50000 ppm, the same hereinafter) and a hydrogen concentration in the space 10a between the external container 10 and the reaction tube 205 does not increase, the space 10a is heated by the heater 207 and supply of hydrogen gas begins with the process gas supply unit while the $N_2$ gas is continuously supplied by the inert gas supply unit.

The heating of the space 10a by the heater 207 is performed such that the inside of the reaction chamber 201 has a predetermined temperature (such that surfaces of the wafers 200 have a predetermined process temperature). Specifically, a temperature of the heater 207 is controlled based on a temperature measured using the heater thermocouple 11a and the cascade thermocouple 11b (heating step). Also, the supply of the hydrogen gas by the process gas supply unit is performed by opening the opening/closing valve 30c while the flow rate of the hydrogen gas by the mass flow controller 30b after a temperature increase by the heater 207 is completed (after the surfaces of the wafers 200 have the predetermined process temperature). When the supply of the hydrogen gas by the process gas supply unit is started, pressure in the reaction tube 205 (pressure in the reaction chamber 201) is retained at a predetermined pressure level by adjusting a degree of opening the APC valve 20b (process gas supply step). In this case, an atmosphere in the reaction tube 205 (an atmosphere in the reaction chamber 201) is exhausted using the exhaust pipe 20 and the vacuum pump 20a while the hydrogen gas is supplied (exhaust step).

(Rapid Cooling Process)

After the supply of the hydrogen gas begins with the process gas supply unit, an oxygen concentration is measured using the oxygen concentration meter 61, a hydrogen concentration is measured using the hydrogen concentration meter 62, a temperature in the space 10a between the external container 10 and the reaction tube 205 is measured using the heater thermocouple 11a, and then a rapid cooling process is started. Specifically, if (i) an oxygen concentration in the space 10a between the external container 10 and the reaction tube 205 is less than a critical concentration, (ii) a hydrogen concentration in the space 10a between the external container 10 and the reaction tube 205 does not increase, and (iii) the temperature in the space 10a between the external container 10 and the reaction tube 205 is less than a critical temperature, then the heating by the heater 207 is suspended and exhausting by the exhaust unit begins and the atmosphere (outside air) is introduced into the external container 10 while the hydrogen gas is continuously supplied using the process gas supply unit (refrigerant supply step). The exhausting by the exhaust unit is performed by opening the shutters 51 and 52 while the blower 53 is operated (refrigerant exhaust step). Thus, the atmosphere (outside air) is introduced into the external container 10 from the ventilation port 15 installed at the lower portion of the side wall of the external container 10, and circulated in the external container 10 from bottom to top, thereby rapidly cooling (air-cooling) the reaction tube 205.

(Atmospheric Pressure Recovery Process and Substrate Unloading Process)

After the cooling of the reaction tube 205 is completed, the hydrogen gas remaining in the reaction tube 205 is eliminated, an inert gas is supplied into the reaction tube 205 by an inert gas supply unit (not shown), and pressure in the reaction tube 205 is recovered to atmospheric pressure (atmospheric pressure recovery process). Also, the inside of the transfer chamber 124 below the reaction tube 205 is exhausted via the exhaust opening 132 which is a transfer chamber exhaust unit (transfer chamber refrigerant exhaust unit) while supplying an inert gas into the transfer chamber 124 from the atmosphere ventilation port 131 which is a transfer chamber gas supply unit (transfer chamber refrigerant supply unit), and a gas exhausted from the transfer chamber 124 is discharged to exhaust equipment in the clean room CR. Then, the boat elevator 115 is moved downward to unload the processed wafers 200 from the reaction chamber 201 to the transfer chamber 124 (substrate unloading process). Also, when air can be introduced into the transfer chamber 124, the exhaust gas may be discharged to the clean room CR.

In the rapid cooling process, power is generated by collecting exhaust heat from the reaction container 202. As described above, the heat exchanger 300 installed at the refrigerant exhaust pipe 50 of the reaction container 202 heats a working medium by heat-exchanging the working medium with an exhaust gas that is exhausted from the refrigerant exhaust pipe 50 and that is then heated. Here, a heat source of the exhaust gas includes the heater 207 installed in the space 10a which is a refrigerant flow path that communicates with the refrigerant exhaust pipe 50, the reaction container 202, and the wafers 200 heated in the reaction container 202. The vapor turbine 304 installed in the working medium path 310 in which a working medium flows is driven by the working medium. When the vapor turbine 304 is driven, the generator 305 is driven to generate power.

Also, power is generated by collecting heat from the wafers 200 in the unloading process. As described above, a working medium is heated by the heat exchanger 302 configured by, e.g., a radiator, which is installed at the exhaust opening 132 of the transfer chamber 124. The vapor turbine 304 installed in the working medium path 310 in which a working medium flows is driven by the working medium. When the vapor turbine 304 is driven, the generator 305 is driven to generate power. The working medium is cooled by the cooler 306 configured by, e.g., a condenser, which is installed in the working medium path 310. The cooled working medium is delivered to the heat exchanger 300 by the working medium pump 307 installed in the working medium path 310.

For example, as heat sources discharged in the rapid cooling process and the unloading process, the temperature of a refrigerant exhausted from the reaction container 202 is about 750° C. and the temperature of a substrate unloaded from the reaction container 202 to the transfer chamber 124 is about 450° C. In contrast, in the case of a power plant or a blast furnace, the temperature of a heat source is 1,000° C. or more. For example, the temperature of a heat source in the case of a blast furnace is nearly 1600° C.

Also, in the substrate processing apparatus according to the present embodiment, cycle conditions when a Rankine cycle as described above with reference to FIGS. 3A, 3B, and 10 is performed to collect heat will be briefly described below. Here, it is assumed that the heat exchanger 300 is the second heat exchanger 303, the vapor turbine 304 is a scroll type expander, and the cooler 306 is a condenser.

1. Isobaric change: (1)→(2) heating (boiling) A working medium (liquid) is heated to 308 K (35° C.) by the heat exchanger 303 and is then boiled to obtain vapor, and the vapor is heated up to 358 K (85° C.). The temperature of hot water supplied as cooling water to the heat exchanger 303 is 368 K (95° C.), and the difference between the temperatures of the hot water and a thermal working medium is 10 K (10° C.). The quantity of heat received from hot water is set to 10 kW, and a required amount of the thermal working medium is 0.0519 kg/s.

2. Adiabatic change: (2)→(3) expansion Adiabatic expansion is performed on the vapor from 2.4 MPa (358 K) to 0.9 MPa (308 K) using a scroll-type expander as the vapor turbine 304. The generator 305 is driven by the scroll-type expander to generate power.

3. Isobaric change: (3)→(4) cooling (condensation)

The vapor of 308 K (35° C.) is cooled by the condenser which is the cooler 306 to return to the liquid working medium of 308 K (35° C.). The temperature of cooling air supplied to the condenser is 298 K (25° C.), and the difference between the temperatures of the cooling air and the liquid working medium is 10 K (10° C.).

4. Isenthalpic change: (4)→(1) pressurization The liquid working medium is pressurized from 0.9 MPa to 2.4 Mpa by the working medium pump 307, and is then delivered to the heat exchanger 303.

(Effects of The Embodiment)

(1) According to the present embodiment, the Rankine cycle is used as a power generation cycle. In the Rankine cycle, alternative Freon R-134 is vaporized using a heat source to operate the vapor turbine 304. If the temperature of the heat source is 1,600° C., similar to that of a blast furnace, a gas may be efficiently generated. Thus, the efficiency of power generation is 40% or more. However, in a substrate processing apparatus according to the present embodiment, the temperature of a refrigerant from which a heat source is exhausted is 750° C. and the temperature of a substrate unloaded from the reaction container 202 is 450° C., the amount of a gas to be generated is low, thus lowering the efficiency of power generation. From this viewpoint, according to the present embodiment, heat is collected from a combination of outside air introduced into the space 10a and the heated wafers 200 which are two types of heat sources, thereby improving the efficiency of power generation.

(2) Also, exhaust heat may be efficiently collected according to a heat cycle using the Rankine cycle, and power may be generated from the collected exhaust heat, thereby easily reusing the exhaust heat. Also, the exhaust heat may be reused as power of the substrate processing apparatus and thus the power of the substrate processing apparatus may be saved. Also, the exhaust heat may be used as power of a device, thereby enabling energy saving.

(3) Since exhaust heat discharged from the reaction chamber 201 and the transfer chamber 124 may be effectively transformed into power in the Rankine cycle, the amount of the exhaust heat to be discharged into the air may be reduced.

(4) When heat from the refrigerant exhaust pipe 50 which is refrigerant exhaust heat is supplied to the heat exchanger 301 in the rapid cooling process, a large amount of heat may be collected from the reaction chamber 201 and the wafers 200, compared to a standby process (a standby period). Here, the standby period means a preparation state or a waiting state of the substrate processing apparatus, i.e., a time period when a film is not formed. Also, when the unloading process is performed to supply heat to the heat exchanger 302 from the exhaust opening 132 which is the second gas exhaust unit, a larger amount of heat may be collected from the heated wafers 200 than in other processes such as the loading process. As described above, heat may be collected from a combination of a plurality of heat sources, thereby greatly improving the efficiency of power generation.

Also, in the present embodiment, exhaust heat is collected in the rapid cooling process. When exhaust heat is collected by supplying a refrigerant into the space 10a during a processing process, a process temperature cannot be maintained in the reaction chamber 201 and thus the exhaust heat cannot be collected. Also, since exhaust heat is collected from the exhaust pipe 20 using the vacuum pump 20a rather than the blower 53 in the processing process, the exhaust heat cannot be efficiently collected. Since exhaust heat is collected in the rapid cooling process according to the present embodiment, the exhaust heat can be efficiently collected.

Although exhaust heat of a refrigerant is collected in the reaction chamber 201 during the rapid cooling process in the present embodiment, the exhaust heat of the refrigerant may be collected during a standby period. Although the temperature of the heater 207 during the standby period is lower the temperature of the heater 207 when a film is formed, the exhaust heat can be easily collected.

Although the wafers 200 are cooled by introducing air into the transfer chamber 124, the present invention is not limited thereto and the wafers 200 may be cooled by introducing an inert gas onto the wafers 200 or films formed on the wafers 200. For example, the wafers 200 may be cooled by introducing nitrogen ($N_2$) gas into the transfer chamber 124.

[Second Embodiment]

Next, a second embodiment of the present invention will be described.

In the previous embodiment, not only is heat collected using one Rankine cycle device in the rapid cooling process or a normal state (a standby state or a rapid cooling state) but heat of wafers is also collected when a boat is down in the unloading process. However, substrates may be cooled by further installing another Rankine cycle device and performing a cooling cycle reverse to the Rankine cycle when the boat is down. The Rankine cycle device may cool a heat source by reversely performing the Rankine cycle. In this case, substrates may be effectively cooled at high speeds, although there are cases in which power should be supplied from the outside.

Figure 2:
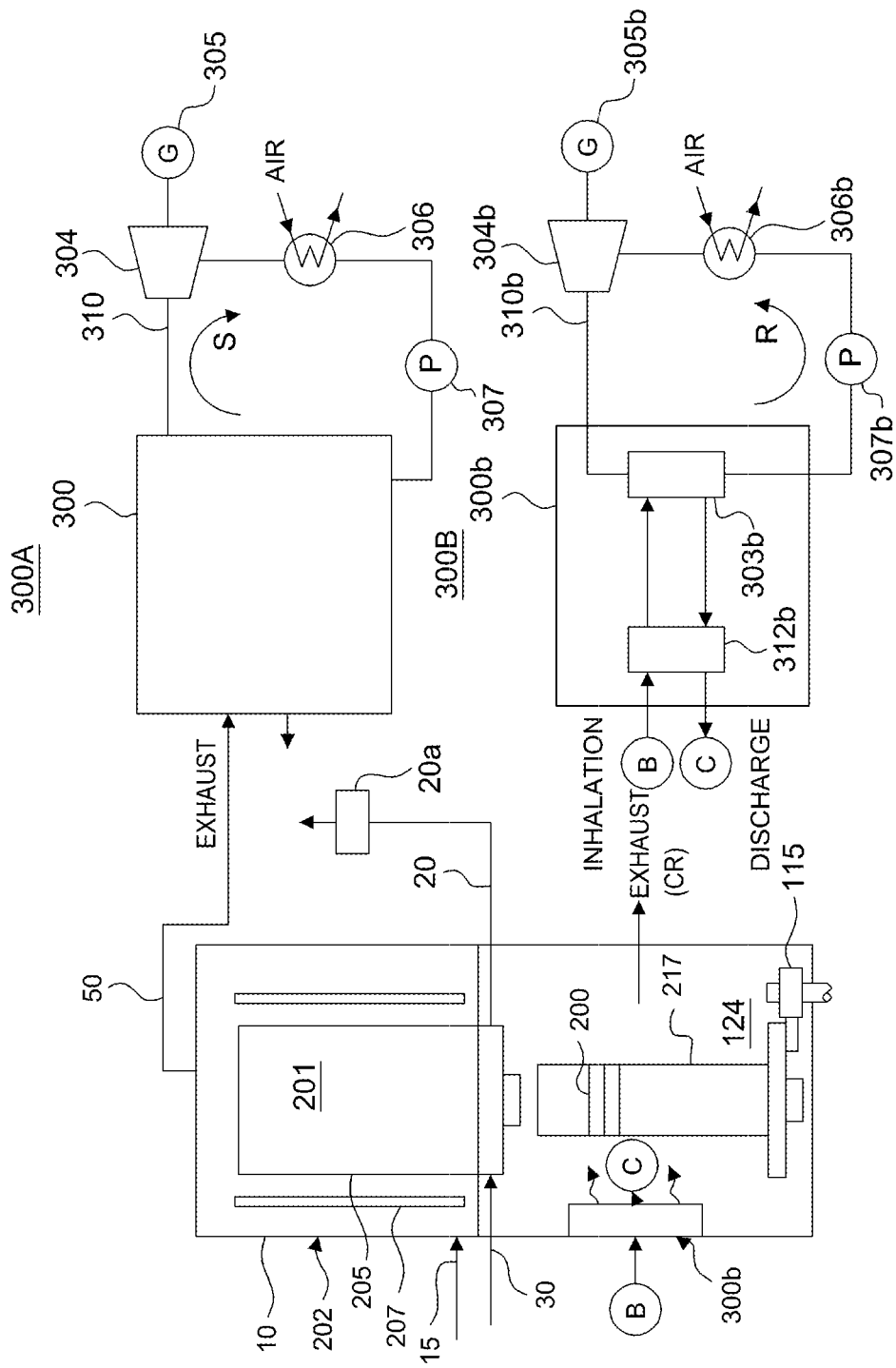
FIG. 2 is a diagram schematically illustrating a structure of a substrate processing apparatus that includes a Rankine cycle device according to another embodiment of the present invention.

FIG. 2 is a diagram schematically illustrating a structure of a substrate processing apparatus using such a cooling cycle according to another embodiment of the present invention. In the substrate processing apparatus of FIG. 2, not only a first Rankine cycle device 300A but also a second Rankine cycle device 300B are installed, the cooling cycle is performed by reversely performing the Rankine cycle, and wafers 200 in a transfer chamber 124 are cooled using cooling air discharged from a heat exchanger 300b of the second Rankine cycle device 300B instead of another heat exchanger (radiator), compared to the substrate processing apparatus of FIG. 1 according to the first embodiment.

Figure 10:
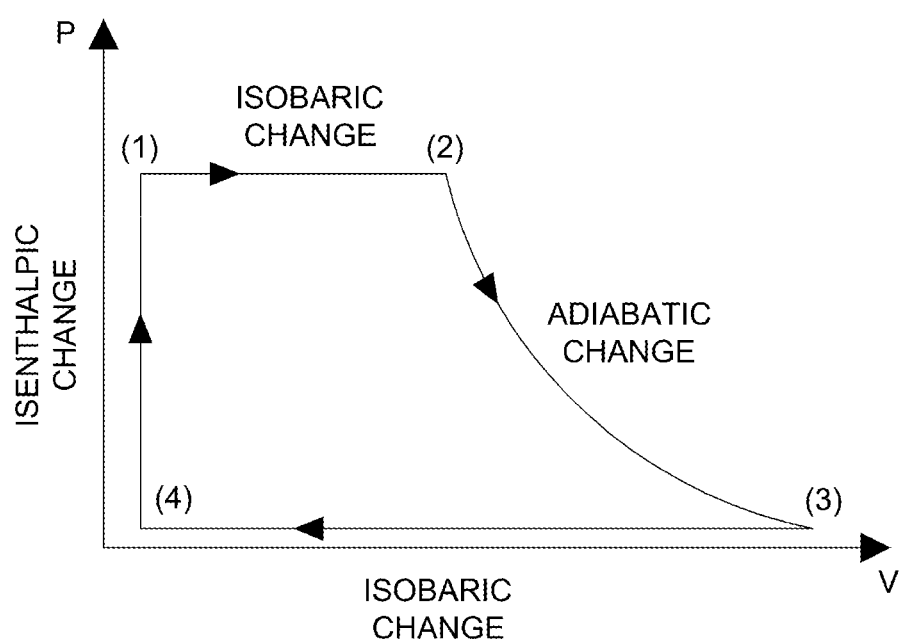
FIG. 10 is a graph showing a Rankine cycle according to an embodiment of the present invention.

The cooling cycle will now be described in detail with reference to FIG. 2. A vapor turbine 304b and a working medium pump 307b are configured as reversely rotatable type devices, e.g., scroll-type devices. As described above, in the Rankine cycle in a normal state (a standby state or a rapid cooling state), a refrigerant serving as a working medium flows in a working medium path 310 in a direction indicated by an arrow S, causes the vapor turbine 304 to rotate, is cooled by a cooler 306, and is then delivered to the heat exchanger 300 by a working medium pump 307. That is, as illustrated in FIG. 10, the refrigerant repeatedly undergoes four steps, i.e., (1) heating, (2) expansion, (3) condensation, and (4) compression, in the order of (1)→(2)→(3)→(4)→(1). In contrast, in the cooling state, a refrigerant flows in a direction indicated by an arrow R and repeatedly undergoes four steps, i.e., (1) cooling, (2) compression, (3) condensation, and (4) expansion, in the order of (2)→(1)→(4)→(3)→(2).

In the second Rankine cycle device 300B, a liquid heating medium collects heat from a gas inhaled in the heat exchanger 300b, discharges cooling air, and vaporizes a refrigerant serving as a working medium to generate vapor. The generated refrigerant becomes heating vapor while in an isopiestic state and is then delivered to the working medium pump 307b. The heating vapor delivered to the working medium pump 307b changes a high-pressure and temperature gas through adiabatic compression and is then delivered to the cooler 306b. The high-pressure and temperature gas delivered to the cooler 306b, e.g., a condenser, is cooled to become a super-refrigerant and is then supplied to the vapor turbine 304b which is a scroll-type expander. The super-refrigerant is expanded to become a low-temperature and pressure refrigerant (moist vapor) by a scroll-type expander and is then delivered to the heat exchanger 303b. Here, in order to drive the vapor turbine 304, the generator 305 may be rotated as an electric motor by supplying external power thereto if needed. Also, the heat exchanger 300b and the working medium pump 307b described above are configured to be controlled by the heat exchange control unit 80e and the working medium pump control unit 80f connected to the main controller 501.

A heat exchanger 300b (a third heat exchanger) that constitutes the second cycle device 300B) is installed at an air inlet of the transfer chamber 124 in which a clean filter 134a is installed. Also, only the first heat exchanger 312b may be installed at the air inlet. Cooling air C discharged from the heat exchanger 312b of the second Rankine cycle device 300B is delivered to the transfer chamber 124 and supplied into the transfer chamber 124 via the clean filter 134a of FIG. 6. Unlike in the related art or the previous embodiment in which air of a normal temperature is supplied into the transfer chamber 124, cooling air that is cooler than the normal-temperature air is supplied into the transfer chamber 124 and thus the wafers 200 unloaded from the reaction container 202 may be thus rapidly cooled. Also, the air used to cool the wafers 200 is exhausted into a clean room CR. The temperature of the cooling air cooled by the second Rankine cycle device 300B is, for example, 100° C.

As described above, power is generated from heat collected using the first Rankine cycle in a heating (processing) process, and the wafers 200 are cooled using cooling heat collected by performing a cooling cycle converted from the second Rankine cycle in an unloading process of unloading the wafers 200. Thus, by using different methods of collecting heat, not only may the efficiency of power generation be improved but the processed wafers 200 may also be rapidly cooled, thus improving the unloading throughput (substrate cooling speed). Also, environmental load may be reduced using heat collecting and cooling.

Also, when the wafers 200 are rapidly cooled, exhaust heat is preferably collected from an exhaust gas that is exhausted from the transfer chamber 124 using first Rankine cycle device 300A as described above.

[Third Embodiment]

In the previous two embodiments, cases in which a vertical-type substrate processing apparatus capable of simultaneously processing a plurality of substrates is used have been described. However, the present invention is not limited thereto and is applicable to single-wafer type apparatuses capable of processing one or a plurality of wafers at once.

Figure 8:
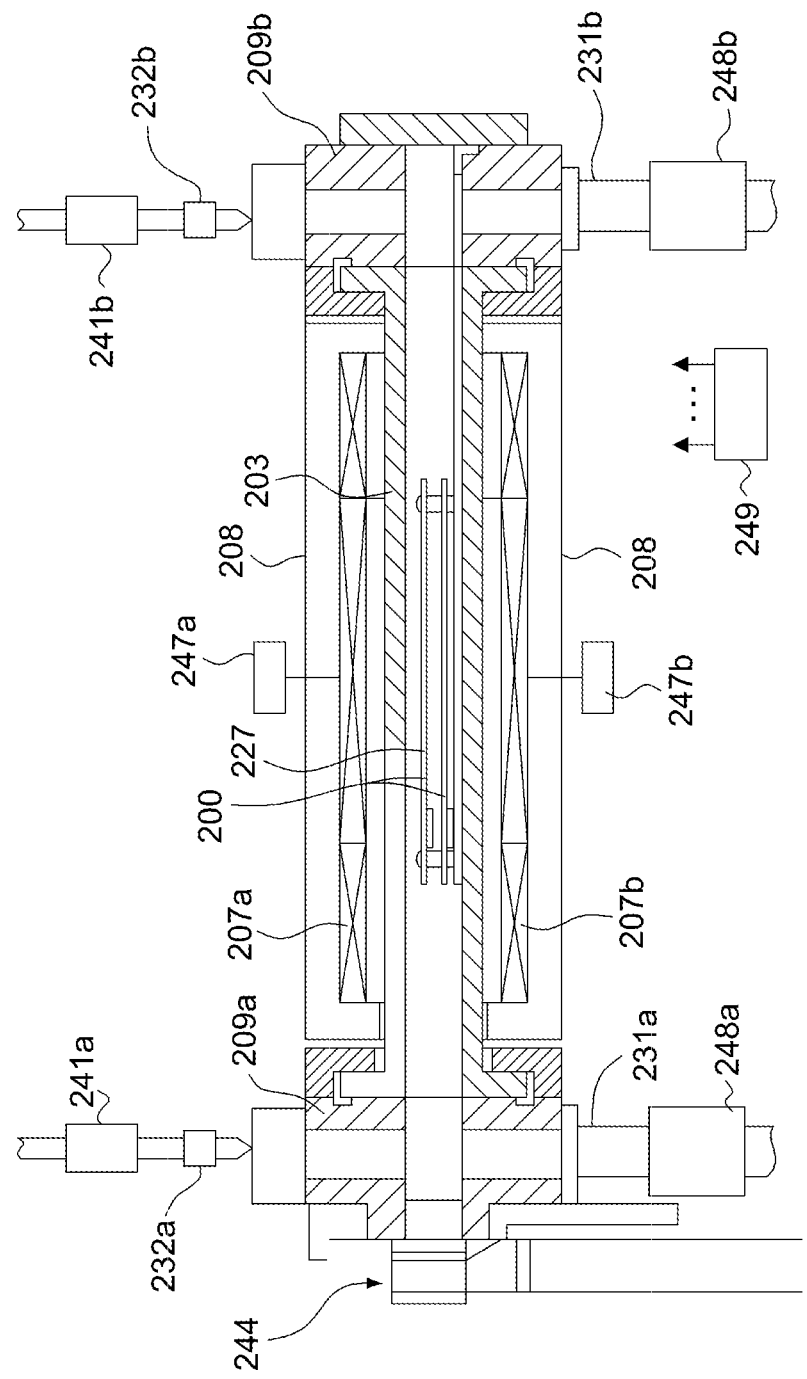
FIG. 8 is a schematic cross-sectional view of a process furnace of a 2-wafer type apparatus which is a substrate processing apparatus according to an embodiment of the present invention.

A two-wafer type apparatus which is a substrate processing apparatus according to another embodiment of the present invention will be briefly described with reference to FIG. 8 below. FIG. 8 is a schematic cross-sectional view of a process furnace of a substrate processing apparatus according to an embodiment of the present invention.

A reaction tube 203 serving as a reaction container formed of quartz, silicon carbide, or aluminum has a horizontally planar space and accommodates semiconductor wafers 200 therein. In the reaction tube 203, a wafer support platform 227 is installed as a supporter to support the semiconductor wafers 200, and gas introduction flanges 209a and 209b are airtightly installed as a manifold at both ends of the reaction tube 203. A transfer chamber (not shown) is disposed adjacent to the gas introduction flange 209a at one end the reaction tube 203 via a gate valve 244.

Gas introduction lines 232a and 232b serving as supply pipes, and exhaust lines 231a and 231b serving as exhaust pipes communicate with the gas introduction flanges 209a and 209b, respectively. Mass flow controllers 241a and 241b serving as the flow rate control unit (flow rate control device) 80b to control the flow rate of a gas to be introduced into the reaction tube 203 are installed at the gas introduction lines 232a and 232b, respectively. Also, pressure controllers 248a and 248b serving as the pressure control unit (pressure control device) 80c are installed at the exhaust lines 231a and 231b, respectively, to control the pressure in the reaction tube 203.

An upper heater 207a and a lower heater 207b serving as heating units (heating devices) are installed above and below the reaction tube 203, respectively, and configured to heat the inside of the reaction tube 203 evenly or to have a predetermined temperature gradient. Also, temperature controllers 247a and 247b serving as the temperature control unit (temperature control device) 80a are connected to the upper heater 207a and the lower heater 207b to control temperatures of the upper and lower heaters, respectively. Also, an insulator 208 is installed as an insulating member to cover the upper heater 207a, the lower heater 207b, and the reaction tube 203.

The temperature in the reaction tube 203, the pressure in the reaction tube 203, and the flow rate of a gas to be supplied into the reaction tube 203 are controlled to be predetermined levels by the temperature controllers 247a and 247b, the pressure controllers 248a and 248b, and the mass flow controllers 241a and 241b, respectively. Also, the temperature controllers 247a and 247b, the pressure controllers 248a and 248b, and the mass flow controllers 241a and 241b are controlled by the main controller 501 serving as a main control unit (a main control device).

Next, a substrate processing method performed using a process furnace of the substrate processing apparatus described above will be described as a process included in a process of manufacturing a semiconductor device. In the following description, operations of various elements of the substrate processing apparatus are controlled by the main controller 501.

In a state in which the temperature in the reaction tube 203 is maintained to be equal to a process temperature by the upper and lower heaters 207a and 207b, the gate valve 244 is opened to load semiconductor wafers 200 into the reaction tube 203 in a left direction of the FIG. 8 by a wafer transport robot (not shown), and the semiconductor wafers 200 are placed on the wafer support platform 227. In the present embodiment, two wafers 200 are placed on the wafer support platform 227, and are processed simultaneously. To equalize thermal histories of the two wafers 200 to be processed simultaneously, the two wafers 200 are simultaneously transferred into the reaction tube 203. The temperatures of the wafers 200 begin to be raised to a process temperature while the two wafers 200 are simultaneously transferred into the reaction tube 203.

After the wafer transport robot moves backward and the gate valve 244 is closed, the pressure in the reaction tube 203 is controlled to be equal to a process pressure by the pressure controllers 248a and 248b (pressure stabilization), and the temperature in the reaction tube 203 is controlled by the temperature controllers 247a and 247b such that the temperatures of the wafers 200 are equal to the process temperature (temperature stabilization). When the pressure in the reaction tube 203 and the temperatures of the wafers 200 are stabilized, the inside of the reaction tube 203 is exhausted from the exhaust lines 231a and 231b while an inert gas is introduced into the reaction tube 203 via the gas introduction lines 232a and 232b via the gas introduction lines 232a and 232b. Accordingly, the inside of the reaction tube 203 has an inert gas atmosphere.

After the pressure in the reaction tube 203 is stabilized at the process pressure and the temperatures of the wafers 200 are stabilized at the process temperature, the wafers 200 are processed when a process gas is introduced into the reaction tube 203 via the gas introduction lines 232a and 232b and the inside of the reaction tube 203 is exhausted from the exhaust lines 231a and 231b. In this case, for uniform processing, the process gas is preferably supplied in a diagonal direction in an alternate manner. That is, a direction in which the process gas flows is preferably changed according to time, for example, by supplying the process gas toward the exhaust line 231b from the gas introduction line 232a to be roughly horizontal with respect to surfaces of the wafers 200, and supplying the process gas in a direction opposite to this direction, i.e., toward the exhaust line 231a from the gas introduction line 232b to be roughly horizontal with respect to surfaces of the wafers 200. When uniform processing does not depend on the direction in which the process gas flows, the process gas may be controlled to flow in one direction. That is, for example, the process gas may be controlled to flow either from the gas introduction line 232a toward the exhaust line 231b to be roughly horizontal with respect to the surfaces of the wafers 200 or from the gas introduction line 232b toward the exhaust line 231a to be roughly horizontal with respect to the surfaces of the wafers 200.

After the wafers 200 are processed, in order to remove a remnant gas from the inside of the reaction tube 203, the inside of the reaction tube 203 is exhausted from the exhaust lines 231a and 231b to purge the inside of the reaction tube 203 by introducing an inert gas into the reaction tube 203 from the gas introduction lines 232a and 232b. Also, the supply flow rate of the process gas when the wafers 200 are processed, and the supply flow rate of the inert gas before or after the wafers 200 are controlled by the mass flow controllers 241a and 241b.

After the inside of the reaction tube 203 is purged, the pressure in the reaction tube 203 is adjusted to be equal to a wafer transfer pressure by the pressure controllers 248a and 248b. After the pressure in the reaction tube 203 is adjusted to be equal to the wafer transfer pressure, the gate valve 244 is opened to unload the processed wafers 200 from the reaction tube 203 to the transfer chamber by the wafer transport robot.

Also, under control of the main controller 501, the pressure in the reaction tube 203 is controlled by the pressure controllers 248a and 248b, the temperature in the reaction tube 203 is controlled by the temperature controllers 247a and 247b, and the flow rate of a gas to be supplied into the reaction tube 203 is controlled by the mass flow controllers 241a and 241b.

The Rankine cycle device described above is connected to the exhaust lines 231a and 231b and an exhaust unit (not shown) of the transfer chamber of such a single-wafer processing apparatus. Thus, not only may energy of the single-wafer processing apparatus be saved but power may also be efficiently generated by collecting exhaust heat from the single-wafer processing apparatus.

[Modified Examples]

The present invention is, however, limited to the above-described embodiments, and may be embodied in various forms by those of ordinary skill in the technical field to which the present invention pertains without departing from the technical idea of the present invention.

(1) Although heat of the heater 207 in the reaction container 202, heated substrates, and the heated reaction container 202 is collected in the form of a gas from the space 10a which is a refrigerant flow path installed in the reaction chamber in the above-described embodiments, the present invention is not limited thereto. For example, heat energy generated from a heating element heated to a high temperature is preferably collected by the heat exchanger 300 in the Rankine cycle. Thus, heat, such as power of the heater 207, power of a plasma generator, and power of plasma, may be collected in the form of a gas or a liquid. Also, in order to secure a sealing material of a furnace port or safety, heat may be collected from cooling water for cooling the reaction container 202. When heat is collected from the cooling water, not only the first heat exchanger 312 having a vapor-liquid heat exchange function but also a heat exchanger having a liquid heat exchange function may be installed.

(2) Also, although a substrate processing process in which a substrate is processed by supplying hydrogen ($H_2$) gas onto a surface of the substrate has been described above as a process performed by a substrate processing apparatus in the above-described embodiments, the present invention is not limited thereto. For example, the process performed by the substrate processing apparatus may include a process such as oxidation, nitridation, CVD, plasma treatment, etc.

(3) In the above-described embodiments, the Rankine cycle is applied to generating power, but the Brayton cycle and a combined cycle of the Rankine cycle and the Brayton cycle are also applicable. Also, power may be generated using a thermoelectric conversion element, provided that the efficiency of power generation or cost saving can be increased.

(4) Also, although air is used as a gas supplied into the transfer chamber, $N_2$ gas or other gases may be used.

According to the one or more embodiments of the invention set forth here, not only may energy of a substrate processing apparatus be saved but power may also be efficiently generated by collecting heat exhausted from the substrate processing apparatus.

[Exemplary Embodiments]

Exemplary embodiments of the present invention will be supplementarily described below.

<Supplementary Note 1>

According to one aspect of the present invention, there is provided a substrate processing apparatus including: a reaction chamber where a substrate is heated; a transfer chamber configured to accommodate the substrate heated in the reaction chamber; a refrigerant flow path installed at the reaction chamber; a reaction chamber refrigerant supply unit configured to supply a first refrigerant into the refrigerant flow path; a reaction chamber refrigerant exhaust unit configured to exhaust the first refrigerant from the refrigerant flow path; a transfer chamber refrigerant supply unit installed in the transfer chamber; a transfer chamber refrigerant exhaust unit installed in the transfer chamber; a heat exchanger connected to the reaction chamber refrigerant exhaust unit and the transfer chamber refrigerant exhaust unit; a turbine connected to the heat exchanger; a generator connected to the turbine; and a control unit configured to control the reaction chamber refrigerant supply unit and the transfer chamber refrigerant supply unit.

<Supplementary Note 2>

In the substrate processing apparatus of Supplementary note 1, it is preferable that the control unit controls the reaction chamber refrigerant supply unit to supply the first refrigerant after the substrate is heated and the transfer chamber refrigerant supply unit to supply a second refrigerant when the substrate is transferred from the reaction chamber to the transfer chamber.

<Supplementary Note 3>

It is preferable that the substrate processing apparatus of Supplementary note 1 or 2 further includes: a cooler connected to the turbine; and a working medium pump connected to the cooler.

<Supplementary Note 4>

In the substrate processing apparatus of Supplementary note 3, it is preferable that the generator and the working medium pump are controlled to supply vapor from the heat exchanger to the turbine and the vapor from the turbine to the cooler, and supply a working medium from the cooler to the heat exchanger.

<Supplementary Note 5>

In the substrate processing apparatus of Supplementary note 3, it is preferable that the heat exchanger generates vapor by performing heat exchange between the working medium and each of the first refrigerant and the second refrigerant, the working medium pump pressurizes the vapor, the cooler condenses the vapor pressurized by the working medium pump, the turbine expands and delivers the working medium condensed by the cooler to the heat exchanger, and the generator drives the turbine.

<Supplementary Note 6>

According to another aspect of the present invention, there is provided a method of manufacturing a semiconductor device, including: (a) transferring a substrate from a transfer chamber to a reaction chamber; (b) heating the substrate in the reaction chamber; and (c) supplying a first refrigerant to a refrigerant flow path installed in the reaction chamber; exhausting the first refrigerant; and generating power from heat of the exhausted first refrigerant; and (d) transferring the substrate from the reaction chamber to the transfer chamber; supplying a second refrigerant into the transfer chamber with the substrate accommodated in the transfer chamber; exhausting the second refrigerant from the transfer chamber; and generating power from heat of the exhausted second refrigerant.

<Supplementary Note 7>

According to another aspect of the present invention, there is provided a semiconductor device manufacturing apparatus including a reaction chamber in which a substrate is heated; a transfer chamber configured to transfer the heated substrate; a refrigerant flow path installed in the reaction chamber; a refrigerant supply unit installed in the refrigerant flow path; a refrigerant exhaust unit installed in the refrigerant flow path; a transfer chamber refrigerant supply unit installed in the transfer chamber; a transfer chamber refrigerant exhaust unit installed in the transfer chamber; a heat exchanger connected to the refrigerant exhaust pipe and the transfer chamber refrigerant exhaust unit; a turbine connected to the heat exchanger; a generator connected to the turbine; and a control unit configured to control the refrigerant supply unit and the transfer chamber refrigerant supply unit.

<Supplementary Note 8>

According to another aspect of the present invention, there is provided a substrate processing method including a process of transferring a substrate from a transfer chamber to a reaction chamber; a process of heating the substrate in the reaction chamber; a cooling process including a step of supplying a refrigerant to a refrigerant flow path installed in the reaction chamber, a step of exhausting the refrigerant, and a step of generating power from heat of the exhausted refrigerant; and a substrate unloading process including a step of transferring the substrate from the reaction chamber to the transfer chamber, a step of supplying the refrigerant into the transfer chamber while the processed substrate is accommodated in the transfer chamber, a step of exhausting the refrigerant from the transfer chamber, and a step of generating power from heat of the exhausted refrigerant.

<Supplementary Note 9>

According to another aspect of the present invention, there is provided a non-transitory computer-readable recording medium storing a program that causes a computer to execute: a sequence of transferring a substrate from a transfer chamber to a reaction chamber; a sequence of heating the substrate in the reaction chamber; a cooling sequence including supplying a first refrigerant to a refrigerant flow path installed in the reaction chamber, exhausting the first refrigerant, and generating power from heat of the exhausted first refrigerant; and a substrate unloading sequence including transferring the substrate from the reaction chamber to the transfer chamber, supplying a second refrigerant into the transfer chamber while the substrate is accommodated in the transfer chamber, exhausting the second refrigerant from the transfer chamber, and generating power from heat of the exhausted second refrigerant.

<Supplementary Note 10>

According to another aspect of the present invention, there is provided a non-transitory computer recording medium storing a program that causes a computer to execute a sequence of transferring a substrate from a transfer chamber to a reaction chamber; a sequence of heating the substrate in the reaction chamber; a cooling sequence including a step of supplying a refrigerant into a refrigerant flow path installed in the reaction chamber, a step of exhausting the refrigerant, and a step of generating power from heat of the exhausted refrigerant; and a substrate unloading process including a step of transferring the substrate from the reaction chamber to the transfer chamber, a step of supplying the refrigerant into the transfer chamber while the processed substrate is accommodated in the transfer chamber, a step of exhausting the refrigerant from the transfer chamber, and a step of generating power from heat of the exhausted refrigerant.

<Supplementary Note 11>

According to another aspect of the present invention, there is provided a substrate processing apparatus including: a reaction chamber where a substrate is heated; a heating unit configured to heat the reaction chamber; a refrigerant flow path installed in the reaction chamber; a refrigerant supply unit configured to supply a refrigerant into the refrigerant flow path; a refrigerant exhaust unit configured to exhaust the refrigerant from the refrigerant flow path; a transfer unit configured to transfer the substrate between the transfer unit and the reaction chamber; a transfer chamber configured to accommodate the transfer unit; a transfer chamber gas supply unit configured to supply a gas into the transfer chamber; a transfer chamber exhaust unit configured to exhaust an inside of the transfer chamber; a heat exchanger installed in the refrigerant exhaust unit and the transfer chamber exhaust unit, and configured to heat a working medium by the refrigerant exhausted from the refrigerant exhaust unit and the gas exhausted from the transfer chamber exhaust unit; a turbine configured to introduce the working medium; a generator connected to the turbine; a cooler configured to cool the working medium discharged from the turbine; a working medium pump configured to deliver the working medium cooled by the cooler to the heat exchanger; and a control unit configured to control the heating unit, the reaction chamber refrigerant supply unit, the refrigerant exhaust unit, the transfer unit, the transfer chamber exhaust unit, the heat exchanger and the working medium pump.

<Supplementary Note 12>

In the substrate processing apparatus of Supplementary note 11, it is preferable that the control unit controls at least the refrigerant exhaust unit, the transfer chamber exhaust unit and the heat exchanger such that heat is supplied to the heat exchanger from at least the refrigerant exhaust unit in a rapid cooling process performed after the substrate is heated in the reaction chamber, and that heat is supplied to the heat exchanger from the transfer chamber exhaust unit in a unloading process wherein the substrate is unloaded from the reaction chamber to the transfer chamber.

<Supplementary Note 13>

In the substrate processing apparatus of Supplementary note 11 or 12, it is preferable that the heat exchanger inhales the gas in the transfer chamber, collects heat from the gas, discharges a cooling gas into the transfer chamber refrigerant supply unit, and vaporizes the working medium to generate vapor, the working medium pump pressurizes the vapor, the cooler condenses the vapor pressurized by the working medium pump, and the turbine expands and delivers the working medium condensed by the cooler to the heat exchanger, and drives the generator.

<Supplementary Note 14>

According to another aspect of the present invention, there is provided a method of manufacturing a semiconductor device, the method including a process of transferring a substrate to a reaction chamber using a transfer unit installed in a transfer chamber which is a space to which the substrate is to be transferred; a substrate processing process including a step of heating the substrate using a heating unit, a step of supplying a process gas into the reaction chamber using a gas supply unit, and a step of exhausting the inside of the reaction chamber using a gas exhaust unit; a rapid substrate cooling process including a step of supplying a refrigerant into a refrigerant flow path using a refrigerant supply unit after the substrate processing process, and a step of exhausting the refrigerant from the refrigerant flow path using a refrigerant exhaust unit; and a substrate unloading process including a step of supplying a gas into the transfer chamber using an inert gas supply unit, a step of exhausting the inside of the transfer chamber using the inert gas exhaust unit, and a step of transferring the substrate from the reaction chamber to the transfer chamber using the transfer unit. The rapid substrate cooling process includes a step of causing a heat exchanger installed in the refrigerant exhaust unit to heat a working medium by collecting heat from at least one of a gas exhausted from the refrigerant exhaust unit and a gas exhausted from the inert gas exhaust unit; a step of driving a turbine installed in a working medium path in which the working medium flows by the heated working medium; a step of generating power using a generator driven by the turbine; a step of cooling the working medium discharged from the turbine using a cooler installed in the working medium path; and a step of pressurizing the cooled working medium and delivering the pressurized working medium to the heat exchanger using a working medium pump installed in the working medium path. The substrate unloading process includes a step of heating the working medium using the heat exchanger installed in the second gas exhaust unit; a step of driving the turbine, which is installed in the working medium path in which the working medium flows, by the heated working medium; a step of generating power using the generator driven by the turbine; a step of cooling the working medium discharged from the turbine using the cooler installed in the working medium path; and a step of pressurizing the working medium and delivering the pressurized working medium to the heat exchanger using the working medium pump installed in the working medium path.

<Supplementary Note 15>

In the method of Supplementary note 14, it is preferable that the substrate unloading process includes a step of generating vapor by collecting heat from an inhaled gas, discharging a cooling gas, and vaporizing a second working medium using a third heat exchanger; a step of pressurizing the vapor using a second working medium pump installed in a second working medium path in which the working medium flows; a step of condensing the pressurized vapor using a second cooler installed in the working medium path; a step of expanding the condensed vapor using a second turbine installed in the working medium path; and a step of generating power using a second generator connected to the second turbine. The cooling gas is preferably supplied into the transfer chamber using the third heat exchanger serving as a transfer chamber refrigerant supply unit.

<Supplementary Note 16>

According to another aspect of the present invention, there is provided a program that causes a computer to execute a substrate processing sequence including a step of heating a substrate in a reaction chamber using a heating unit, a step of supplying a process gas into the reaction chamber using a gas supply unit, and a step of exhausting the inside of the reaction chamber using a gas exhaust unit; a rapid substrate cooling sequence including a step of supplying a refrigerant into a refrigerant flow path using a refrigerant supply unit after the substrate processing process, and a step of exhausting the refrigerant from the refrigerant flow path using a refrigerant exhaust unit; and a substrate unloading sequence including a step of supplying a gas into the transfer chamber using a transfer chamber refrigerant supply unit, a step of exhausting the inside of the transfer chamber using a transfer chamber refrigerant exhaust unit, and a step of transferring the substrate from the reaction chamber to the transfer chamber using the transfer unit. The rapid substrate cooling process includes a step of causing a heat exchanger installed in the refrigerant exhaust unit to heat a working medium by collecting heat from at least one of a gas exhausted from the refrigerant exhaust unit and a gas exhausted from the inert gas exhaust unit; a step of driving a turbine installed in a working medium path in which the working medium flows by the heated working medium; a step of generating power using a generator driven by the turbine; a step of cooling the working medium discharged from the turbine using a cooler installed in the working medium path; and a step of pressurizing the cooled working medium and delivering the pressurized working medium to the heat exchanger using a working medium pump installed in the working medium path. The substrate unloading process includes a step of heating the working medium using the heat exchanger installed in the transfer chamber refrigerant exhaust unit; a step of driving the turbine, which is installed in the working medium path in which the working medium flows, by the heated working medium; a step of generating power using the generator driven by the turbine; a step of cooling the working medium discharged from the turbine using the cooler installed in the working medium path; and a step of pressurizing the working medium and delivering the pressurized working medium to the heat exchanger using the working medium pump installed in the working medium path.

With a substrate processing apparatus, a method of manufacturing a semiconductor device, and a non-transitory computer-readable recording medium according to the present invention, energy of the substrate processing apparatus can be saved and power can be efficiently generated by collecting exhaust heat from the substrate processing apparatus.

What is claimed is:

1. A substrate processing apparatus comprising:
   a reaction chamber where a substrate is heated;
   a transfer chamber configured to accommodate the substrate heated in the reaction chamber;
   a refrigerant flow path installed at the reaction chamber;
   a reaction chamber refrigerant supply unit configured to supply a first refrigerant into the refrigerant flow path;
   a reaction chamber refrigerant exhaust unit configured to exhaust the first refrigerant from the refrigerant flow path;
   a transfer chamber refrigerant supply unit installed in the transfer chamber;
   a transfer chamber refrigerant exhaust unit installed in the transfer chamber;
   a heat exchanger connected to the reaction chamber refrigerant exhaust unit and the transfer chamber refrigerant exhaust unit;
   a turbine connected to the heat exchanger;
   a generator connected to the turbine; and
   a control unit configured to control the reaction chamber refrigerant supply unit and the transfer chamber refrigerant supply unit;
   wherein the control unit controls the reaction chamber refrigerant supply unit to supply the first refrigerant after the substrate is heated and the transfer chamber refrigerant supply unit to supply a second refrigerant when the substrate is transferred from the reaction chamber to the transfer chamber.

2. The substrate processing apparatus of claim 1, further comprising:
a cooler connected to the turbine; and
a working medium pump connected to the cooler.

3. The substrate processing apparatus of claim 2, wherein the control unit controls the generator and the working medium pump such that vapor supplied from the heat exchanger to the turbine is supplied from the turbine to the cooler, and that a working medium is supplied from the cooler to the heat exchanger.

4. The substrate processing apparatus of claim 2, wherein the heat exchanger generates vapor by performing heat exchange between the working medium and each of the first refrigerant and the second refrigerant, the working medium pump pressurizes the vapor, the cooler condenses the vapor pressurized by the working medium pump, the turbine expands and delivers the working medium condensed by the cooler to the heat exchanger, and the generator drives the turbine.

5. The substrate processing apparatus of claim 1, further comprising:
a cooler connected to the turbine; and
a working medium pump connected to the cooler.

6. A method of manufacturing a semiconductor device, comprising:
(a) transferring a substrate from a transfer chamber to a reaction chamber;
(b) heating the substrate in the reaction chamber;
(c) supplying a first refrigerant to a refrigerant flow path installed in the reaction chamber; exhausting the first refrigerant; and generating power from heat of the exhausted first refrigerant;
(d) transferring the substrate from the reaction chamber to the transfer chamber; supplying a second refrigerant into the transfer chamber with the substrate accommodated in the transfer chamber; exhausting the second refrigerant from the transfer chamber; and generating power from heat of the exhausted second refrigerant;
(e) performing at least one of: supplying the first refrigerant to a heat exchanger when the first refrigerant is exhausted in the step (c) and supplying the second refrigerant to the heat exchanger when the second refrigerant is exhausted in the step (d);
(f) generating power by rotating a turbine connected to the heat exchanger; and
(g) refrigerating a working medium heated by the heat exchanger and supplied to the turbine.

7. The method of claim 6, further comprising:
(h) supplying the first refrigerant to the refrigerant flow path during a standby period when a heater installed at the reaction chamber is heated without the substrate accommodated in the reaction chamber;
(i) exhausting the first refrigerant; and
(j) generating power by heat of the first refrigerant exhausted in the step (i).

* * * * *